US006611932B2

United States Patent
How et al.

(10) Patent No.: US 6,611,932 B2
(45) Date of Patent: *Aug. 26, 2003

(54) METHOD AND APPARATUS FOR CONTROLLING AND OBSERVING DATA IN A LOGIC BLOCK-BASED ASIC

(75) Inventors: Dana How, Palo Alto, CA (US); Adi Srinivasan, Fremont, CA (US); Robert Osann, Jr., Los Altos, CA (US); Shridhar Mukund, Santa Clara, CA (US)

(73) Assignee: LightSpeed Semiconductor Corporation, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/056,686

(22) Filed: Jan. 24, 2002

(65) Prior Publication Data

US 2002/0073369 A1 Jun. 13, 2002

Related U.S. Application Data

(63) Continuation of application No. 09/488,667, filed on Jan. 20, 2000, which is a continuation-in-part of application No. 08/985,790, filed on Dec. 5, 1997, now Pat. No. 6,223,313.

(51) Int. Cl.[7] .................................................. G01R 31/28
(52) U.S. Cl. ..................... 714/724; 714/726; 324/158.1; 326/46
(58) Field of Search ................................ 714/724, 726; 324/158.1; 326/46, 40, 41, 47; 327/407; 716/7

(56) References Cited

U.S. PATENT DOCUMENTS

| | | | |
|---|---|---|---|
| 4,441,075 A | 4/1984 | McMahon | 324/73 |
| 4,556,840 A | 12/1985 | Russell | 32/73 |
| 4,701,921 A | 10/1987 | Powell et al. | 371/25 |
| 4,706,216 A | 11/1987 | Carter | 365/94 |
| 4,786,904 A | 11/1988 | Graham, III et al. | 340/825.83 |

(List continued on next page.)

FOREIGN PATENT DOCUMENTS

JP       06109816       4/1994

OTHER PUBLICATIONS

Chip Express® Powerpoint Presentation, as downloaded from www.chipexpress.com on Sep. 10, 1996.
Zilinx® The Programmable Logic Data Book, Sep. 1996, pp. 13–14, 2–294–2–295, 4–11–4–17.
Frake et al., a Scan–testable Mask Programmable Gate Array for Conversion of FPGA Designs, IEEE May 3, 1992, Custom Integrated Circuits Conference.
Brown et al., FPGA and CPLD Architectures: A Tutorial, Summer 1996, IEEE Design & Test of Computers, pp. 42–57.
Bursky, Efficient Ram–based FPGAs Ease System Design, Jan. 22, 1996, Electronic Design, p. 53–60.

*Primary Examiner*—Emmanuel L. Moise
(74) *Attorney, Agent, or Firm*—Quirk & Tratos; Sarah Barone Schwartz

(57) ABSTRACT

A system for testing an integrated circuit, and particularly a gate array, is disclosed which includes, prior to coupling the array to form a user-designed circuit, predesigned logic that enables testing of the user-designed circuit. The predesigned logic allows logic blocks in the array to operate in "freeze" mode or to operate in normal mode, where normal mode is defined by the user-designed circuit. When the logic blocks are selected to be frozen, the logic blocks behave as a series of daisy-chained master-slave flip-flops. In normal mode, a logic block can implement combinational, sequential, or other functions and still later be as a master-slave flip-flop. Moreover, each logic block is further equipped for addressable mode control, allowing selected logic blocks to be exercised in isolation once stimulus data is shifted in, simplifying test generation and improving fault coverage.

22 Claims, 18 Drawing Sheets

U.S. PATENT DOCUMENTS

| | | | |
|---|---|---|---|
| 4,926,425 A | 5/1990 | Hedtke et al. | 371/22.6 |
| 5,043,986 A | 8/1991 | Agrawal et al. | 371/25.1 |
| 5,054,024 A | 10/1991 | Whetsel | 371/22.3 |
| 5,055,710 A | 10/1991 | Tanaka et al. | 307/303.1 |
| 5,068,603 A | 11/1991 | Mahoney | 324/158 |
| 5,206,184 A | 4/1993 | Allen et al. | 437/51 |
| 5,341,041 A | 8/1994 | El Gamal | 307/446 |
| 5,365,125 A | 11/1994 | Goetting et al. | 326/39 |
| 5,384,533 A | 1/1995 | Tokuda et al. | 324/158.1 |
| 5,386,154 A | 1/1995 | Goetting et al. | 326/44 |
| 5,416,784 A | 5/1995 | Johnson | 371/22.5 |
| 5,448,493 A * | 9/1995 | Topolewski et al. | 716/7 |
| 5,451,887 A | 9/1995 | El-Avat et al. | 326/39 |
| 5,477,165 A | 12/1995 | ElAyat et al. | 326/38 |
| 5,488,316 A | 1/1996 | Freeman et al. | 326/41 |
| 5,500,608 A | 3/1996 | Goetting et al. | 326/39 |
| 5,513,190 A | 4/1996 | Johnson et al. | 371/22.5 |
| 5,528,600 A | 6/1996 | El Ayat et al. | 371/22.1 |
| 5,533,032 A | 7/1996 | Johnson | 371/22.5 |
| 5,534,774 A | 7/1996 | Moore et al. | 324/158.1 |
| 5,550,839 A * | 8/1996 | Buch et al. | 714/724 |
| 5,550,843 A | 8/1996 | Yee | 371/22.3 |
| 5,570,041 A | 10/1996 | El-Avat et al. | 326/41 |
| 5,614,818 A | 3/1997 | El Ayat et al. | 324/158.1 |
| 5,651,013 A | 7/1997 | Iadanza | 371/22.3 |
| 5,691,990 A * | 11/1997 | Kapur et al. | 714/726 |
| 5,809,039 A | 9/1998 | Takahashi et al. | 371/22.3 |
| 5,872,448 A | 2/1999 | Osann, Jr. | 324/158.1 |

\* cited by examiner

METHOD AND APPARATUS FOR CONTROLLING AND OBSERVING DATA IN A LOGIC BLOCK-BASED ASIC

RELATED APPLICATIONS

This is a continuation of U.S. patent application Ser. No. 09/488,667, filed Jan. 20, 2000, which is a continuation-in-part of Ser. No. 08/985,790 filed Dec. 5, 1997 U.S. Pat No. 6,223,313 B1, issued Apr. 24, 2001, each of which are incorporated herein by reference.

FIELD OF INVENTION

The invention generally relates to application specific integrated circuits (ASICs), and more specifically, the invention relates to testing gate arrays.

BACKGROUND

Use of ASICs has become widespread in the semiconductor industry as giving circuit design engineers a relatively high amount of circuit functionality in a relatively small package. In particular, ASICs are customizable integrated circuits that are customized to implement a circuit specified by a design engineer (a "user-designed circuit"). One type of ASIC is the gate array, which generally includes an array of function blocks, each of which are predesigned and/or prefabricated to include a particular number, arrangement, and type of semiconductor devices, e.g., transistors. To customize a gate array to implement a particular user-designed circuit specified by a design engineer, various connections are made among the semiconductor devices within the function block and/or various connections are made among function blocks (i.e., routing is customized).

ASICs, including gate arrays, once customized to implement a user-designed circuit, must be tested to ensure that the user-designed circuit operates properly. Tests must be able to detect faults, which are the results of defects (physical problems with the circuit, e.g., shorts, and/or improper circuit design), resulting in improper or unexpected circuit behavior.

Faults include "Stuck At Faults" (SAFs), delay faults and current faults. SAFs occur when a particular connection in the circuit remains at (is "stuck" at) a logical low level or a logical high level regardless of what signals are applied to the circuit. (As used herein, "logical low" refers to a "0" signal, which is often a ground signal. A "logical high" refers to a "1" signal, which is often a $V_{DD}$ signal.) Delay faults occur when the circuit is designed to accommodate a particular propagation time, but the circuit actually operates much slower than expected. For instance, if a circuit was designed with the belief that there would only be a 5 ns propagation time of a signal between a first point and a second point, but in operation the signal actually takes 15 ns to propagate from the first point to the second point, the circuit may not operate properly. Current faults will often occur in circuits utilizing CMOS devices, which are not supposed to draw current when inactive, but do. The defects that cause current faults can frequently be detected by testing for SAFs.

Well-designed tests of an integrated circuit will generally be able to detect most SAFs at the gate level (i.e., the conceptual circuit design level containing Boolean logic, flip-flops, etc.) by testing all connections between logic elements. In order to test all connections between logic elements, the tester needs to be able to both (1) control, or set, the value at a particular connection and (2) be able to observe the value at the particular connection. For instance, in order to test the connection between point A and point B for Stuck At 0 faults, the tester needs to be able to apply stimulus data that ought to place a logical high on the connection line, and then the tester needs to be able to observe the connection to see if and how the value changes as a result of the stimulus data.

In discrete circuit design, the ability to control and observe a particular circuit is often done by simply probing the various connections among the logic elements of the circuit. However, with integrated circuits, the ability to probe connections internal to the circuit is generally unavailable and other methods of testing have had to be developed as a result.

One method of testing an integrated circuit that enjoys the most popularity among IC designers is "scan" testing, which will be described with reference to the block diagrams of FIGS. 1 and 1A. In FIG. 1, circuit 102 is generally composed of any number and arrangement of logic elements (e.g., Boolean logic gates, flip-flops, latches, etc.) and has input A and output B. Inputs A can be coupled directly to flip-flops 104 (via lines 114) or to other logic elements in logic 102. Likewise, outputs from flip-flops 104 can be coupled directly to outputs B (via lines 112), to other logic elements in logic 102, or directly to other flip-flop 104 inputs. Each flip-flop 104 contained in circuit 102 is coupled to a clock signal such as CLK1 108 or CLK2 109. The flip-flops 104, shown apart from the circuit 102 for illustrative purposes only, will each, upon receiving a triggering clock edge, store a value and hold the value on its respective output until a next triggering clock edge is received. Therefore the flip-flops of circuit 102 collectively represent the state of the circuit: at any time when the clocks are stopped, the flip-flops will maintain the state of the circuit.

By taking advantage of the state-machine nature of the circuit, the state of the circuit 102 can be controlled for test purposes by placing known values into the flip-flops 104. Similarly, the state of the circuit can also be observed by reading the values held in the flip-flops after the circuit has been run. In order to control and observe the values held in flip-flops 104 of the circuit 102, the flip-flops 104 are, in addition to their regular circuit connections represented by lines 112 and 114, coupled to one another in a daisy-chain fashion, i.e., the output of one flip-flop is coupled to the input of the next flip-flop, as generally shown in FIG. 1A. Furthermore, clock steering logic, such as multiplexer 111, is frequently inserted so that all testing and shifting can be effected with one clock signal. To test logic circuit 102, the regular "mission mode" operation of circuit 102 is stopped and a series of stimulus values are shifted into flip-flops 104, via the daisy-chain, so that each flip-flop in logic circuit 102 has a known value. Stimulus values are shifted in by applying the stimulus values one at a time to the input 106 of the first flip-flop in the daisy-chain and running the circuit clock 108 (coupled to the clock input of each flip-flop 104) to propagate the values through the daisy-chain. After the flip-flops 104 have each received a known test value, the circuit 102 is then exercised (run normally) for a brief period, e.g., one clock cycle, and then stopped. The state of the circuit resulting from its being run is captured in flip-flops 104. The resulting values are then shifted out of the flip-flops 104, by again running the clock 108 and reading the values at the output 110 of the last flip-flop in the daisy-chain.

More specifically, to implement scan-type testing, typically one of two techniques is used: mux-based scan or clock-based scan. "Mux-based scan" is the more commonly used technique and is described with reference to the block diagram of FIG. 2. Clock-based scan will be described with reference to FIG. 3.

As shown in FIG. 2, for each flip-flop $104_n$ in the logic circuit 102, (where flip-flops 104 are shown apart from circuit 102 for illustrative purposes only) a 2-input multiplexor $212_n$ is placed at the D-input of each respective flip-flop $104_n$. One input, e.g., the 0 input, for each multiplexor $212_n$ receives the regular connection 114 from the logic 102 that would otherwise go directly into the D-input but for the multiplexor $212_n$. The second input, e.g., the 1 input, of each multiplexor $212_n$ is coupled to the output of a flip-flop $104_{n+1}$, thereby daisy-chaining the flip-flops. As shown in FIG. 2, the Q-output of flip-flop $104_2$ is coupled to the 1-input of multiplexor $212_1$, and the Q-output of flip-flop $104_1$ would be coupled to another multiplexor $212_0$ (not shown). The 1-input to multiplexor $212_2$ would be received from the Q-output of flip-flop $104_3$ (not shown). A circuit clock line (CLK) 108 is coupled to each of the flip-flops $104_n$ as it would be without inclusion of multiplexors $212_n$. A SHIFT signal 214 is coupled to the select input of each of the multiplexors $212_n$. When SHIFT 214 is a logical low, the circuit operates normally, as if the multiplexors were not present. Such normal circuit operation can be used for regular mission mode operation as well as for exercising circuitry during test modes. When SHIFT is a logical high, the circuit is placed in a "shift mode" of operation and test data (stimulus or result values) is shifted into or out of flip-flops $104_n$ by application of a clock signal on CLK 108.

In FIG. 2, to test circuit 102, the circuit 102 is first placed in shift mode by placing a logical high signal on SHIFT 214. The clock signal on CLK 108 is run in a controlled manner while stimulus values are shifted into the flip-flops 104. Once stimulus values are in place, SHIFT 214 is brought to a logical low. The clock signal on CLK 108 is run but controlled to ensure that only a limited number of clock cycles are run, e.g., one clock cycle. Resulting values are then captured in the flip-flops $104_n$ by operation of the last clock edge in this test sequence, also sometimes referred to as a "capture clock." SHIFT is then brought to a logical high, re-entering shift mode, and a signal on CLK 108 is applied to allow the captured data to be shifted out of the flip-flops $104_n$.

While the above testing method is useful as described for detecting SAFs, mux-based scan can also be used to test for delay faults. To do so, test data would be shifted into the flip-flops $104_n$ as described above. Then two clock edges——"a launch clock" and "a capture clock"—are applied on CLK 108 with controlled timing between them. The "launch clock" is the clock edge that places the circuit in a state ready for test. In delay fault testing, the first clock edge that occurs after the stimulus data is finally positioned in flip-flops 104 is the launch clock, while in the SAF testing scenario described above, the launch clock would essentially be the last clock edge to occur in shift mode. The "capture clock" is the clock edge at which resulting values are captured in the flip-flops 104, and is similar in both delay fault and SAF testing. After the launch clock and the capture clock have been applied, data is shifted out of the flip-flops $104_n$ as described above. If the captured data does not correspond to that expected, then a delay fault may be detected.

The flip-flops already present in the user's circuit design are used for testing when using a mux-based scan technique, although each flip-flop in logic circuit 102 is essentially replaced with a multiplexor/flip-flop combination to enable daisy-chaining. Nonetheless, the flip-flops present in the user's logic circuit 102 will often be insufficient to fully test the circuit 102 and additional flip-flop/multiplexor circuitry will need to be added at various points in the design to achieve adequate fault coverage.

Moreover, there are many "design-for-test" rules (DFT rules) that have become generally known and used in designing user-designed circuits as a direct consequence of mux-based scan in order to avoid problems during testing. These DFT rules include the following:

Circuits should preferably not be designed to include falling-edge triggered flip-flops. Otherwise, some flip-flops would be clocked on the rising edge of the circuit clock, and some would be clocked on the falling edge. In such a situation, during a test data shift in, some of the flip-flops may not receive appropriate stimulus values and to avoid this situation extra test flip-flops may need to be included in the daisy-chain.

Clocks should only be designed to be coupled to clock pins and not to the D-input of a flip-flop or a gate that ultimately is coupled to the D-input of a flip-flop. Otherwise, setup and hold time violations may occur during test mode and the circuit will not reliably capture response values.

The Q-output of a flip-flop should not be directly or indirectly (e.g., through combinational logic or drivers) coupled to the clock input of another flip-flop (such as in a Johnson counter), as that clock-input will not be adequately controllable during testing. More generally, clock inputs throughout the circuit must be controllable for testing the circuit.

All gates through which the clock passes must also be controlled during testing to allow the clock to pass uninfluenced by other values during test value shifting. For instance, if the clock signal is applied to the first input of a 2-input AND-gate, where the AND-gate output is applied to the clock input of a flip-flop, then the second input to the AND-gate must be held to a logical high during a test value shift.

All asynchronous clear and reset pins must be gated so they can be prevented from interfering with shift mode.
Other DFT rules are also commonly known. Many of these DFT rules are a direct result of the fact that testing, e.g., controlling and observing values, can only be done with static patterns (logical high and logical low values)—clock edge transitions can not be generated.

Thus, not only does mux-based scan add additional circuitry (e.g., muxes and additional flip-flops) to the circuit, taking up considerable real estate on an integrated circuit, but the DFT rules, which have often developed as a result of the limitations of mux-based scan, have placed considerable limits on the design of the circuit, all to simply allow testing of the circuit.

A second type of scan technique is "clock-based scan", described with reference to the block diagram of FIG. 3. Rather than replacing each flip-flop in the logic circuit 102 with a mux/flip-flop combination as in mux-based scan, the flip-flops $104_n$ in the logic design 102 are replaced with a dual interface flip-flop 304 shown in FIG. 3. Flip-flop 304 is composed of one flip-flop having two interfaces: one interface is shown in lower portion 310 and one interface is shown in the upper portion 312 of flip-flop 304. When placed in a circuit 102, the inputs and outputs (D, Q, CLK) of lower interface 310 are coupled to receive signals used for normal operation (mission mode). The inputs and outputs (TD, TQ) of upper interface 312 are coupled with the upper interface of other flip-flops 304 to form a daisy-chain, and TCLK is coupled to receive a test clock signal, which can be distinct from the regular circuit clock (the "user clock") coupled to CLK.

A signal input to SHIFT 314 indicates whether the upper interface or the lower interface should be active. When the signal coupled to the SHIFT input 314 is a logical low, the upper interface 312 maybe inactive while the lower interface 310 must be active. Thus, when the signal on SHIFT 314 is low, the circuit 102 behaves in mission mode. When the signal on SHIFT 314 is a logical high, the lower interface 310 must be inactive and the upper interface 312 must be active. Stimulus values are shifted into the respective flip-flops 304 via the daisy chained upper-interfaces 312, using TCLK to control the shift mode. Once stimulus values are in place, the circuit will be run in test mode for a controlled time period (i.e., SHIFT receives a logical low), after which SHIFT is again asserted high to enable captured values to be shifted out under control of TCLK. As will be understood by those of skill in the art, clock-based scan can easily mimic mux-based scan. As is also known in the art, device 304 may be a latch having two interfaces (one for mission and test modes and one for shift mode) rather than a flip-flop.

Clock-based scan is advantageous over mux-based scan in that clock-based scan has fewer DFT rules associated with it. Since a separate interface and test clock are used for testing, most clock related DFT rules will no longer need to be followed when designing the underlying circuit. Nonetheless, clock-based scan tends to be more expensive than mux-based scan, causing it to be used less frequently than mux-based scan. In addition, even in clock-based scan, flip-flops will need to be added into the user-designed circuit in places where those present in the user-designed circuit are insufficient for test purposes.

Thus, although scan techniques are widely used to test integrated circuits, they are replete with limitations. Not only do scan techniques add a considerable number of devices to the design of the circuit (e.g., muxes and/or flip-flops), taking up considerable real estate, but use of such additional circuitry will limit the availability of circuitry that could otherwise be used for regular circuit operation. In other words, in a gate array, to insert a multiplexor and/or flip-flop into the circuit for test purposes, various function blocks, or portions thereof, will be sacrificed for testing purposes and become unusable for implementing the logic to be used for the regular (non-test) portion of the circuit. Moreover, when using scan techniques, and mux-based scan in particular, numerous DFT rules will need to be followed just to allow testing of the circuit, limiting the flexibility of circuit design or considerable additional expense will be required to include appropriate dual-interface devices for clock-based scan.

To make it even more difficult to design integrated circuits, test circuitry cannot be inserted into the circuit until the circuit design is substantially complete. More specifically, the knowledge of where the circuit's flip-flops and/or latches are located in the circuit and how they are connected is critical to the ability to insert additional appropriate test circuitry. Typically, once the circuit is designed, then the design is modified for testing purposes, replacing flip-flops in the circuit with a multiplexor/flip-flop combination or a dual-interface flip-flop. Then the circuit must be further analyzed to determine if portions of the circuit need to have additional flip-flops or clock steering logic inserted to adequately test the circuit. Thus, test circuitry can only be added with prior knowledge on the part of the IC designer of the completed circuit design. If space is an issue on the IC, the user's circuit may need to be redesigned to accommodate the test structures.

In addition, the nature of scan requires that once stimulus data is placed in the respective flip-flops, the entire circuit must be exercised simultaneously. Hence, considerable computational effort will have to be made in designing test vectors in order to ensure that appropriate stimulus values will be placed in the circuit as well as to ensure that all parts of the circuit that can influence resulting captured values have been accounted for. Further, having to exercise the entire circuit simultaneously makes faults more difficult to isolate as the source of the problem may not be immediately apparent.

Therefore, a gate array design that inexpensively (in terms of real estate and other resources) implements the testing of a circuit implemented by the gate array without prior knowledge of the circuit, permits full testing of the circuit without complex DFT rules, and allows portions of the circuit to be exercised in isolation from the rest of the circuit, saving considerable time and computational effort, would represent an advancement in the art.

SUMMARY

A system for testing an integrated circuit, and particularly a gate array, is disclosed which overcomes the deficiencies and limitations discussed above. In general, a system in accordance with the invention includes an array of logic blocks, where the logic blocks include a predesigned arrangement of devices and where the logic blocks are couplable to form a user-designed circuit, e.g., by customizing routing. Within the logic blocks and prior to any knowledge of the user-designed circuit, the predesigned arrangement of devices includes logic to enable testing of the user-designed circuit to be later formed. The logic to enable testing allows the logic blocks to be selectable to operate in a freeze mode, a mode unlike the modes of conventional scan, or to operate in normal mode. When selected to operate in a normal mode of operation, each of the logic blocks forms part of the user-designed circuit (when customized), and may operate to perform a sequential logic function, a combinational logic function, a memory logic function, or other function. When selected to operate in freeze mode, the logic blocks operate together as a series of daisy-chained master-slave flip-flops, nonresponsive to user signals, regardless of the underlying function performed by each of the logic blocks in its respective normal mode of operation, as dictated by the user-designed circuit.

Also advantageous over conventional scan, the logic blocks in the array are further predesigned so that each logic block is equipped with addressable mode control, allowing each logic block to be individually selected to exercise (operate in normal mode) while other logic blocks simultaneously remain frozen, driving out stimulus data values.

To test a user-designed circuit, all the logic blocks are first selected, via addressable mode control, to be frozen, thereby forming daisy-chained flip-flops. Stimulus values are shifted into the flip-flops via the daisy-chain. Once shifting has completed, certain isolated and/or nonadjacent logic blocks, selected by addressable mode control, are exercised (i.e., permitted to operate in a normal mode of operation) to verify their operation. Thereafter, all logic blocks are again frozen and then captured data is shifted out of the array. Such a method of testing the user-designed circuit is referred to herein as partition test. Moreover, as discussed previously, such a method of isolated testing is not generally achievable with conventional techniques.

Another method of testing the operation of a user-designed circuit in accordance with the invention is "scan-emulation" testing. To perform scan-emulation testing, first all logic blocks are frozen, via addressable mode control, and then stimulus values are shifted into the logic blocks via the daisy-chained flip-flops. Then all logic blocks are selected, also via addressable mode control, to operate in normal mode. Thereafter, all logic blocks are again selected to freeze. Data captured in the frozen logic blocks (i.e., in the daisy-chained flip-flops) is then shifted out of the array.

During shifting, in addition to the logic blocks each behaving as a flip-flop, the master latch and the slave latch of each flip-flop are capable of latching independent data values, allowing independent control and observation of each latch in the respective flip-flops. To do so, the test clock is independently enabled and disabled to each latch.

Implementing predesigned logic blocks in accordance with the invention permits fully testing a gate array without the user (IC designer) having to insert test structures into the user-designed circuit unlike in conventional scan techniques. Moreover, circuitry to enable testing in accordance with the invention is placed in logic blocks prior to any knowledge of the user-designed circuit, and therefore testing of the user-designed circuit does not depend on placement of flip-flops or other sequential logic in the user-designed circuit.

In addition, a logic block in accordance with the invention is used for dual purposes: (1) during test, it can be selected in an addressable manner to freeze, driving out stimulus data, or (2) the same circuitry that can drive out stimulus data, when not selected to be frozen, will perform in normal mode whatever function is dictated by the user-designed circuit, including combinational, sequential, or other functions. Thus, only a minimal number of devices need be included in the predesigned logic blocks prior to customization by a user to enable test.

Further, logic blocks predesigned in accordance with the invention impose few limitations on designers of user-designed circuits in the form of DFT rules. Thus, using an array including logic blocks in accordance with the invention will have high flexibility for the user in terms of user circuit design. Moreover, because the logic blocks are equipped with addressable mode control, small portions of a user-designed circuit can be tested in isolation. Still, a scan-emulation method of testing can be used with logic blocks predesigned in accordance with the invention for those design engineers who prefer that technique.

More specific details of test circuitry in accordance with the invention are described below.

DETAILED DESCRIPTION OF THE DRAWINGS

The invention will be described with respect to particular embodiments thereof, and reference will be made to the drawings, which are not necessarily drawn to scale, and in which.

DETAILED DESCRIPTION

Figure 4:
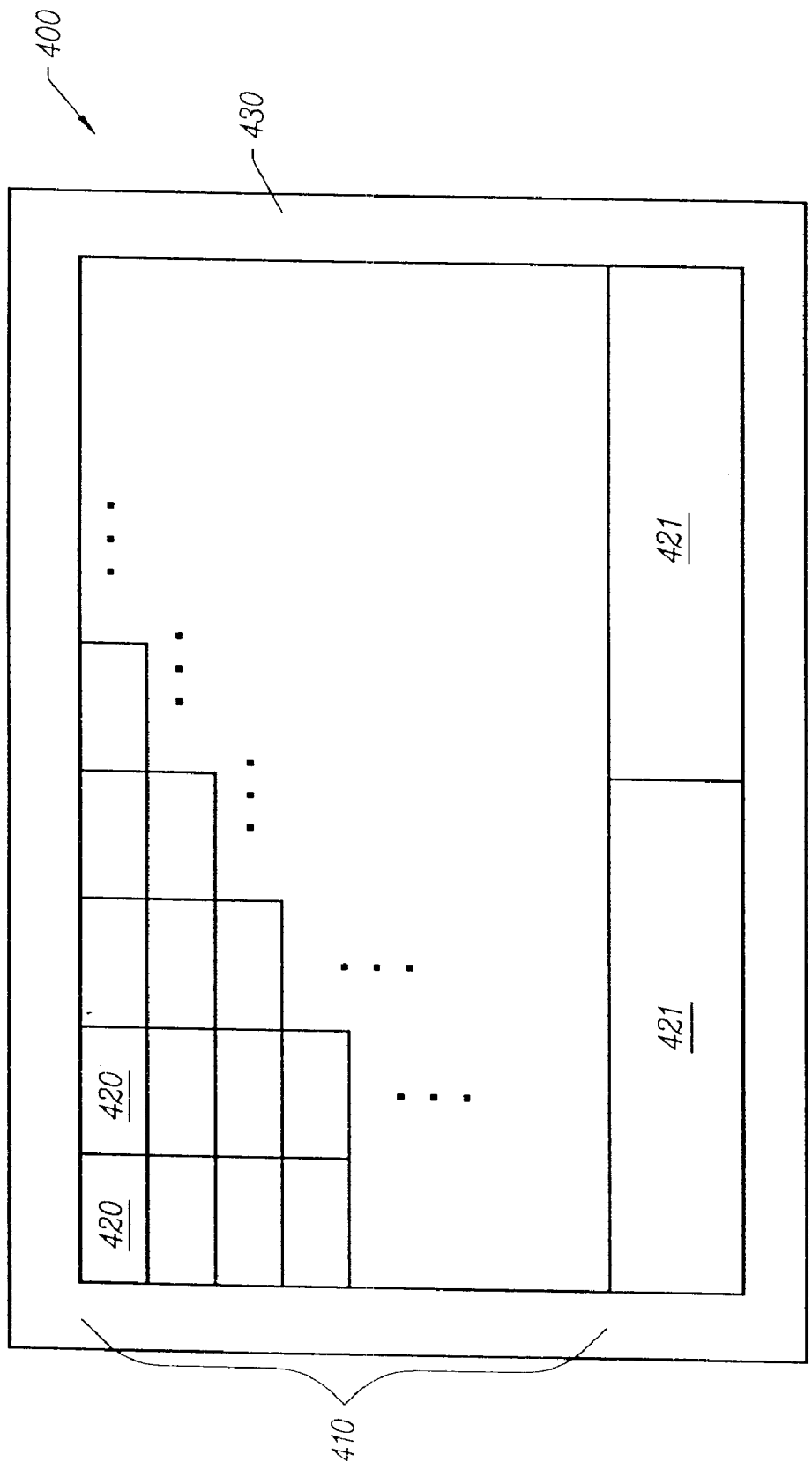
FIG. 4 is a generalized block diagram of an ASIC in accordance with one embodiment of the invention.

A generalized block diagram of an ASIC 400 in accordance with the invention is shown in FIG. 4. ASIC 400 includes an array 410 of function blocks 420. In one embodiment of the invention, each function block 420 is identical to the other function blocks in array 410, although other embodiments of the invention allow for variance among function blocks. Some embodiments may include one or more regions 421, which contain circuitry such as memory blocks or logic cores. Also shown in FIG. 4 is periphery area 430 surrounding array 410. Periphery area 430 includes circuitry such as IO pads, test support circuitry, and other support circuitry for array 410.

Figure 5:
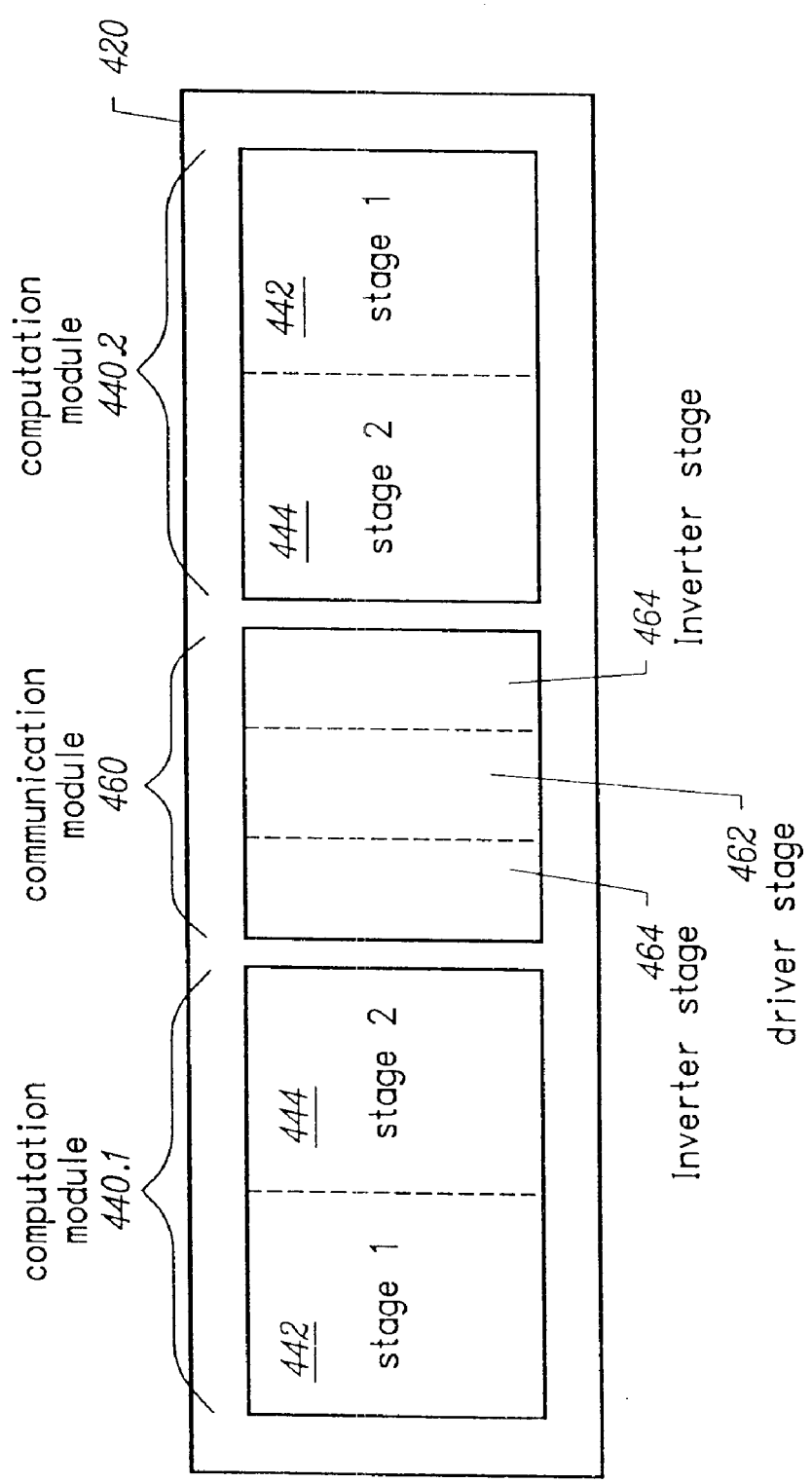
FIG. 5 is a generalized block diagram of a function block 420 in accordance with one embodiment of the invention.

Each function block 420 can be configured to perform combinational functions, sequential functions and/or memory functions (e.g., SRAM). As shown in FIG. 5, one embodiment of function block 420 is composed of three modules: two computation modules 440.1 and 440.2 and a communication module 460. Each module has a predesigned internal architecture, including a predesigned arrangement and coupling of semiconductor devices, but the function performed by each module can be varied by varying input signals to each respective module. Input signals may be varied by coupling the input to a logical high signal, a logical low signal, the output of the same or different module, or a signal from off-chip.

Computation modules 440.1 and 440.2 are identical mirror images of each other in one embodiment of the invention and are generally referred to with reference number 440. Computation module 440 includes a "stage one" logic block 442 and "stage two" logic block 444. In one embodiment of the invention, stage one logic block 442 is a four-input multiplexor (not shown). Stage two logic block (STLB) 444 will be described in more detail with respect to FIG. 6.

Communication module 460 includes a driver stage 462 and two identical inverter stages 464 in one embodiment of the invention. Each inverter stage 464 contains at least one inverter (not shown). The driver stage 462 will be described in more detail with respect to FIG. 19.

A more detailed description of one embodiment of the internal circuit structure of each function block 420, including computation and communication modules 440.1, 440.2, and 460, can be found in application Ser. No. 08/821,475, filed on Mar. 21, 1997, now U.S. Pat. No. 6,014,038 entitled "Function Block Architecture for Gate Array," and incorporated by reference herein.

STLBs

Figure 6:
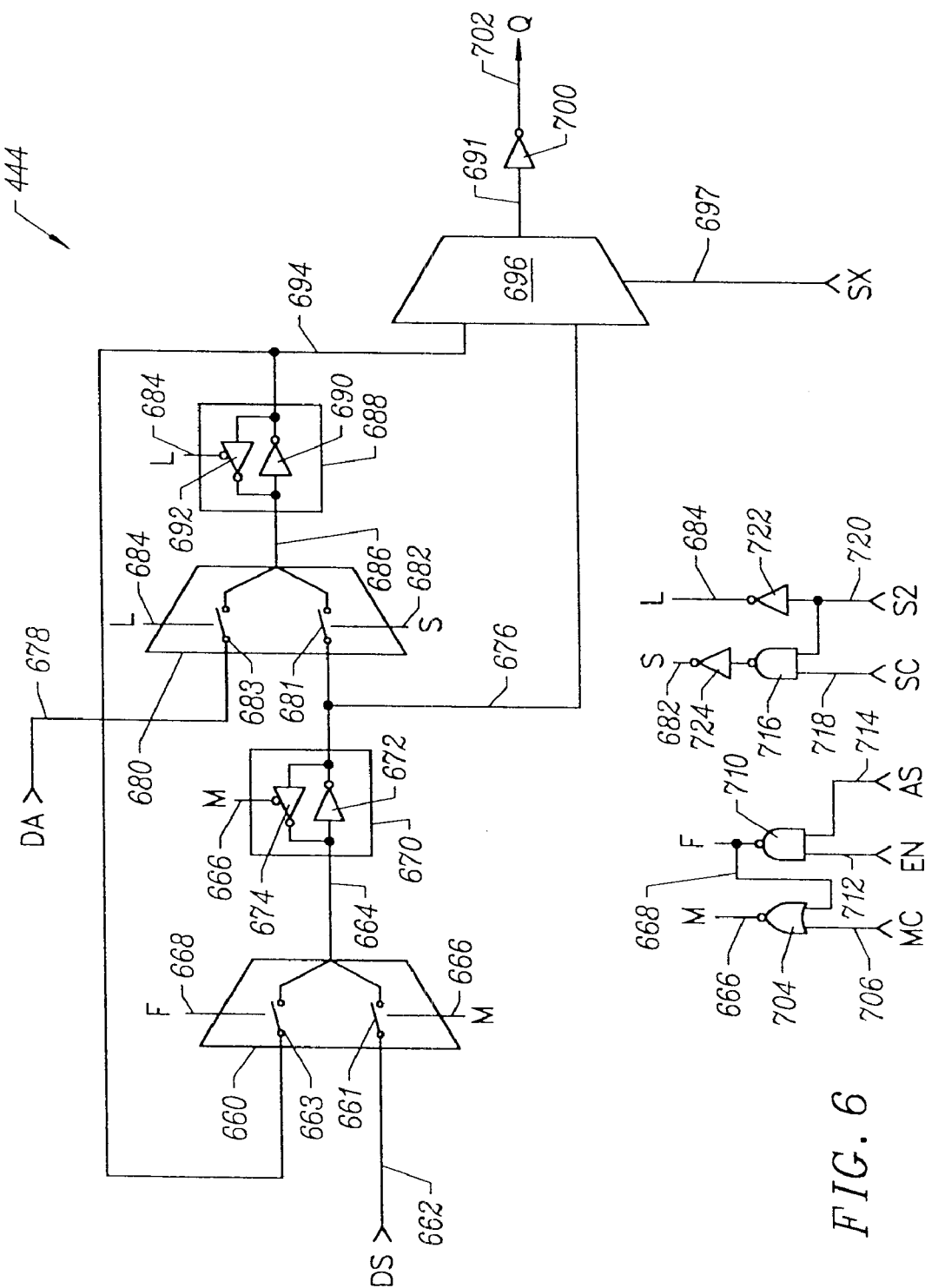
FIG. 6 is a functional block diagram of a stage two logic block 444 in accordance with one embodiment of the invention not showing the circuitry implementing test.

An embodiment of stage two logic block (STLB) 444 of computation module 440 is functionally shown in FIG. 6. STLB 444 generally includes three multiplexors 660, 680, and 696 and two bit storage units 670 and 688. First multiplexor 660 has a first input for receiving a signal DS on line 662 and a second input which is coupled to the output of bit storage unit 688 via line 694. DS serves as a signal input into STLB 444. Multiplexor 660 has two internal paths to its output on line 664. The first, or upper, path couples the input on line 694 to multiplexor output on line 664 when switch 663 is closed. Switch 663 is controlled by signal F on line 668. The second, or lower, path couples the DS signal on line 662 to the output on line 664 when switch 661 is closed. Switch 661 is controlled by signal M on line 666. Multiplexor 660, and others like it, are herein referred to as "dual-control multiplexors."

Bit storage unit 670 receives as an input the output from dual-control multiplexor 660 on line 664. In one embodiment of the invention, bit storage unit 670 is a pair of cross-coupled inverters 672 and 674 as shown in FIG. 6. Inverter 674 is generally designed to be weaker than inverter 690 in order to allow any changing bit outputs from multiplexor 660 to be placed in bit storage unit 670 by overdriving inverter 674. In addition, inverter 674 is enabled and disabled by signal M on line 666. Thus, bit storage unit 670 can be configured to appear as a simple inverter in certain configurations of computation module 440.

Dual-control multiplexor 680 receives as a first input the output of bit storage unit 670 on line 676. The other input to multiplexor 680 is coupled to signal DA on line 678, an input into STLB 444. Similar to multiplexor 660, multiplexor 680 has two signal paths, each controlled by a respective switch 681 or 683. Signal S on line 682 controls switch 681 while signal L on line 684 controls switch 683.

Bit storage unit 688 receives as an input the output of dual-control multiplexor 680 on line 686. Like bit storage unit 670, bit storage unit 688 is, in one embodiment, composed of a pair of cross-coupled inverters 690 and 692, where inverter 692 is weaker than inverter 672, and where inverter 692 is selectively enabled by signal L on line 684.

Multiplexor 696 receives as a first input the output of bit storage unit 688 on line 694. The second input to multiplexor 696 is received from the output 676 of bit storage unit 670.

Multiplexor 696 further has a select input SX, which multiplexor 696 receives on line 697 and which selects one of the multiplexor's inputs to be output onto line 698.

Line 698 is coupled to inverter 700, which serves as a buffering mechanism and which outputs signal Q on line 702.

In addition, STLB 444 also includes select and enable logic, which selects the various switches in multiplexors 660 and 680 as well as enables inverters 674 and 692 in bit storage units 670 and 688, respectively. The select and enable logic in one embodiment includes NOR gate 704, NAND gate 710, NAND gate 716, and inverters 722 and 724.

NOR gate 704 has a first input MC on line 706, an input into STLB 444, and a second input received from the output of NAND gate 710 via line 668. NOR gate 704 outputs signal M on line 666, which controls switch 661 and enables inverter 674.

Inputs to NAND gate 710 are EN on line 712 and AS on line 714, both inputs to STLB 444. The output 668 from NAND gate 710 is the signal F which controls switch 663 in multiplexor 660.

NAND gate 716 receives as inputs signal SC on line 718 and signal S2 on line 720, both inputs to STLB 444. The output of NAND gate 716 is coupled to inverter 724, which outputs signal S on line 682 to control switch 681 in multiplexor 680.

Inverter 722 also receives signal S2 on line 720 and outputs signal L on line 684 to control switch 683 of multiplexor 680 as well as inverter 692 in bit storage unit 688.

While select and enable logic for STLB 444 is shown in FIG. 6 as NOR, NAND, and inverting gates, a person of ordinary skill in the art will recognize that a number of other gate combinations are possible. Further, select and enable logic is not shown fully connected in FIG. 6 to aid in the clarity of the figures. However, the connections should be clear to those of skill in the art by the signal names and/or line reference numbers provided. Similar techniques are employed for clarity in other figures as well.

Figure 7:
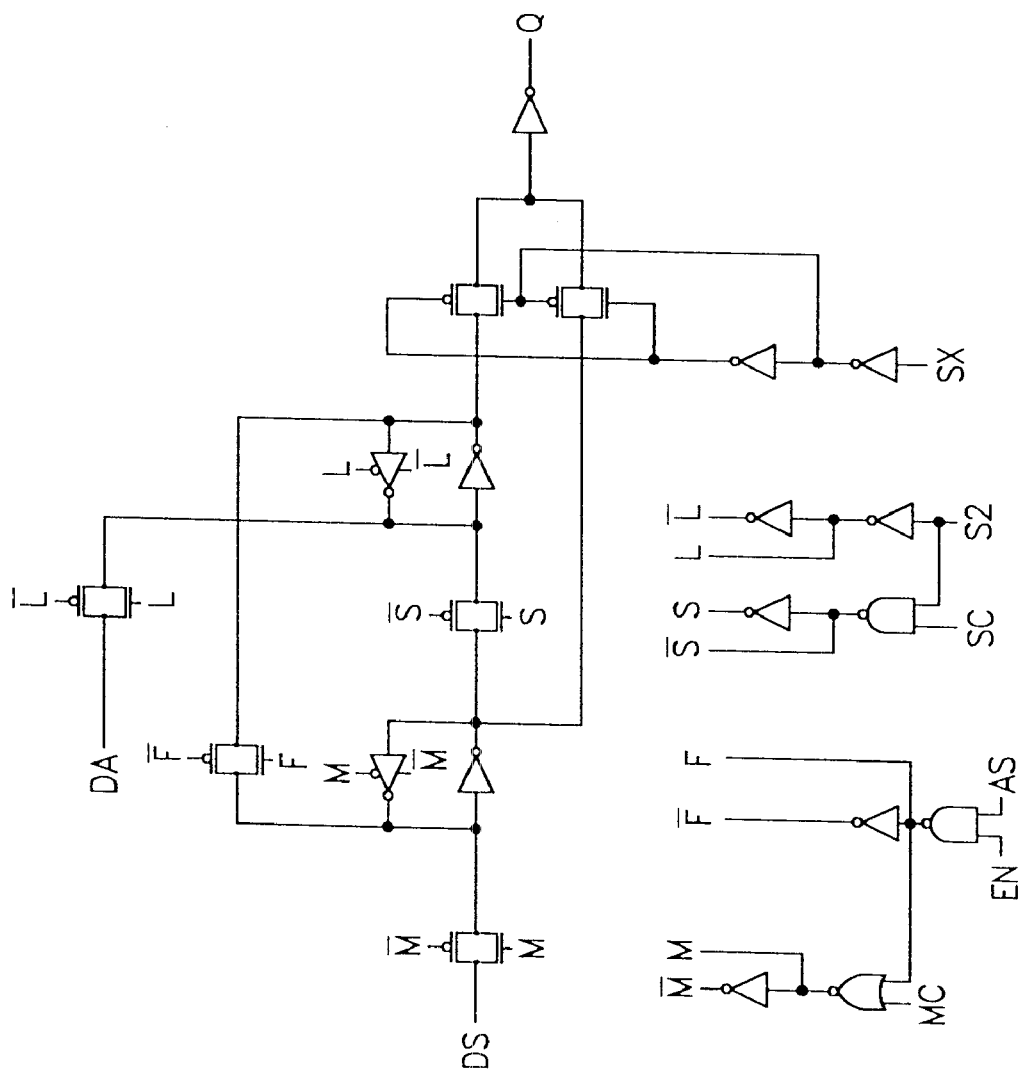
FIG. 7 is a schematic diagram of FIG. 6.

FIG. 7 shows one specific implementation of the functional model shown in FIG. 6. Transmission gates are used to implement the multiplexor/switch functions shown in FIG. 6. Pass gates would also be an acceptable alternative to transmission gates in other embodiments of the invention. Specific details of FIG. 7 will not be further discussed as they will be clear to one of skill in the art upon a comparison of FIG. 7 with FIG. 6. It should further be clear to one of ordinary skill in the art that, although logic gates and inverters are shown, the logic gates in FIG. 7 and other figures are implemented with various transistor configurations. Moreover, one skilled in the art will recognize in FIG. 7 and other figures that various additions, deletions and/or rearrangements of inverters and/or logic gates will still result in an equivalent circuit.

Figure 8:
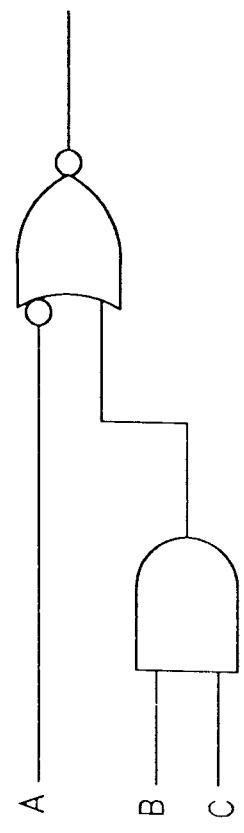
FIG. 8 is a functional block diagram of combinational logic that can be implemented by the circuit shown in FIG. 6.

As shown in FIG. 6, STLB 444 is quite flexible and can, by varying the signals coupled to its inputs, be configured to operate as a combinational, sequential, or memory function, as described in detail in U.S. application Ser. No. 08/821,475, now U.S. Pat. No. 6,014,038 incorporated by reference above. For instance, STLB 444 can implement a combinational function, such as a 2-input AND gate whose output is coupled to one of the inputs of a 2-input NOR gate, as shown in FIG. 8. To do so, signal A is coupled to be received on input SX. Signal B is coupled to be received on input EN and signal C is coupled to be received on input AS, while DA, DS, MC, SC, and S2 are all tied to a logical low signal. Output Q on line 702 is the output of the function.

Figure 10:
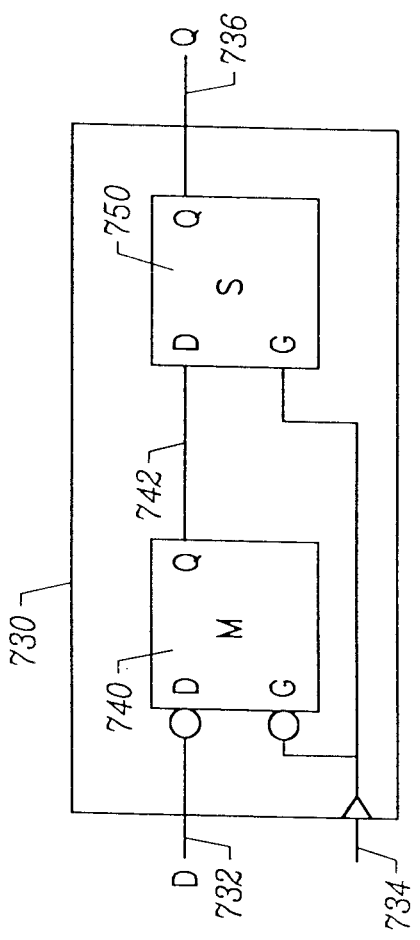
FIG. 10 is a more detailed functional block diagram of the D-type flip-flop of FIG. 9, including a master latch and a slave latch.
Figure 9:
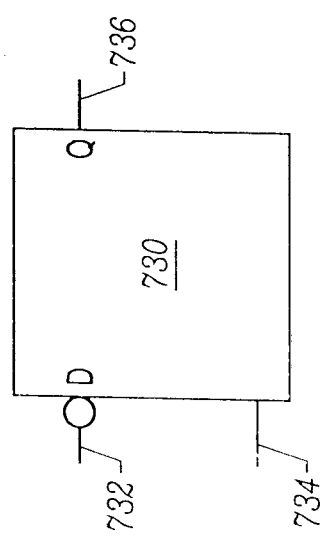
FIG. 9 is a functional block diagram of a D-type flip-flop.

The circuit shown in FIG. 6 can also be configured to implement a sequential function. FIG. 9 shows a flip-flop 730 including D-input 732, clock input 734, and Q output 736. FIG. 10 shows the flip-flop of FIG. 9 broken down into a master latch 740 and a slave latch 750. In FIG. 10, the Q output of the master latch 740 is coupled by line 742 to the D input of the slave latch 750. The slave latch 750 produces Q output 736. To implement the flip-flop shown in FIGS. 9 and 10, the circuit of FIG. 6 is configured with its inputs in the following manner. The data input (D) to the flip-flop is coupled to input DS. The output Q from STLB 444 is also the Q output of the flip-flop shown in FIG. 9. A clock signal is applied to input MC and SC. Additionally, if enable, clear and/or preset are desired, an enable signal is applied to input EN and a clear signal or a preset signal is applied to inputs AS and S2. DA is connected to a logical low for a clear signal or to a logical high for a preset signal. SX is tied to a logical low. In this manner, a data bit input at DS will pass serially through bit storage unit 670 and bit storage unit 688, and the implementation acts as a master-slave flip-flop similar to that shown in FIG. 10.

When bit storage units 670 and 688 are implemented with cross-coupled inverters in an embodiment of the invention, inverters 672 and 690 should be stronger than inverters 692 and 674, respectively. Thus, when the input data from the multiplexor to the bit storage unit changes states (e.g., 0 to 1), the input data will overdrive inverter 674 and/or inverter 692. When switch 661 opens (on a high clock signal), the cross-coupled inverters of bit storage unit 670 remain undisturbed and hold the last bit stored. In like manner, when switch 681 opens, the cross-coupled inverters of bit storage unit 688 remain undisturbed and hold the last bit stored.

A latch can be implemented in a similar manner as a flip-flop, but only one bit storage unit needs to be utilized. To form a latch with an active low gate, S2 would serve as the latch gate, while the DA line would serve as the D input to the latch and Q would serve as the latch output. SC, MC, DS, and SX would all be held to a logical low while AS and EN would be held at a logical high. To form a latch with an active high gate, SC would serve as the latch gate, DS would serve as the D input to the latch, and Q would be the latch output. S2, EN, and AS would be held to a logical high while MC, SX, and DA would each be held to a logical low.

STLB Modified for Test

Figure 1:
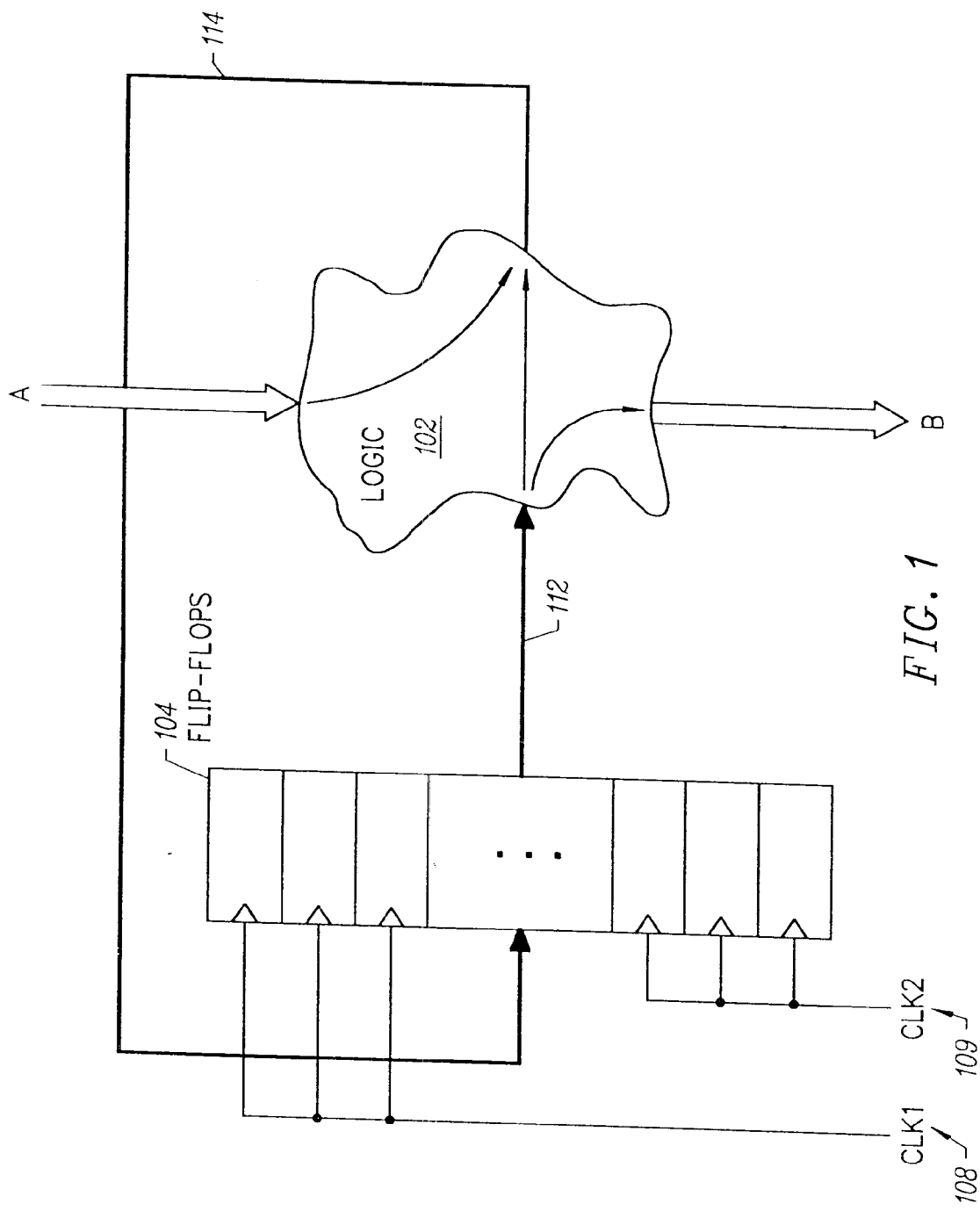
FIG. 1 is a generalized functional block diagram of a circuit including a plurality of flip-flops.
Figure 1A:
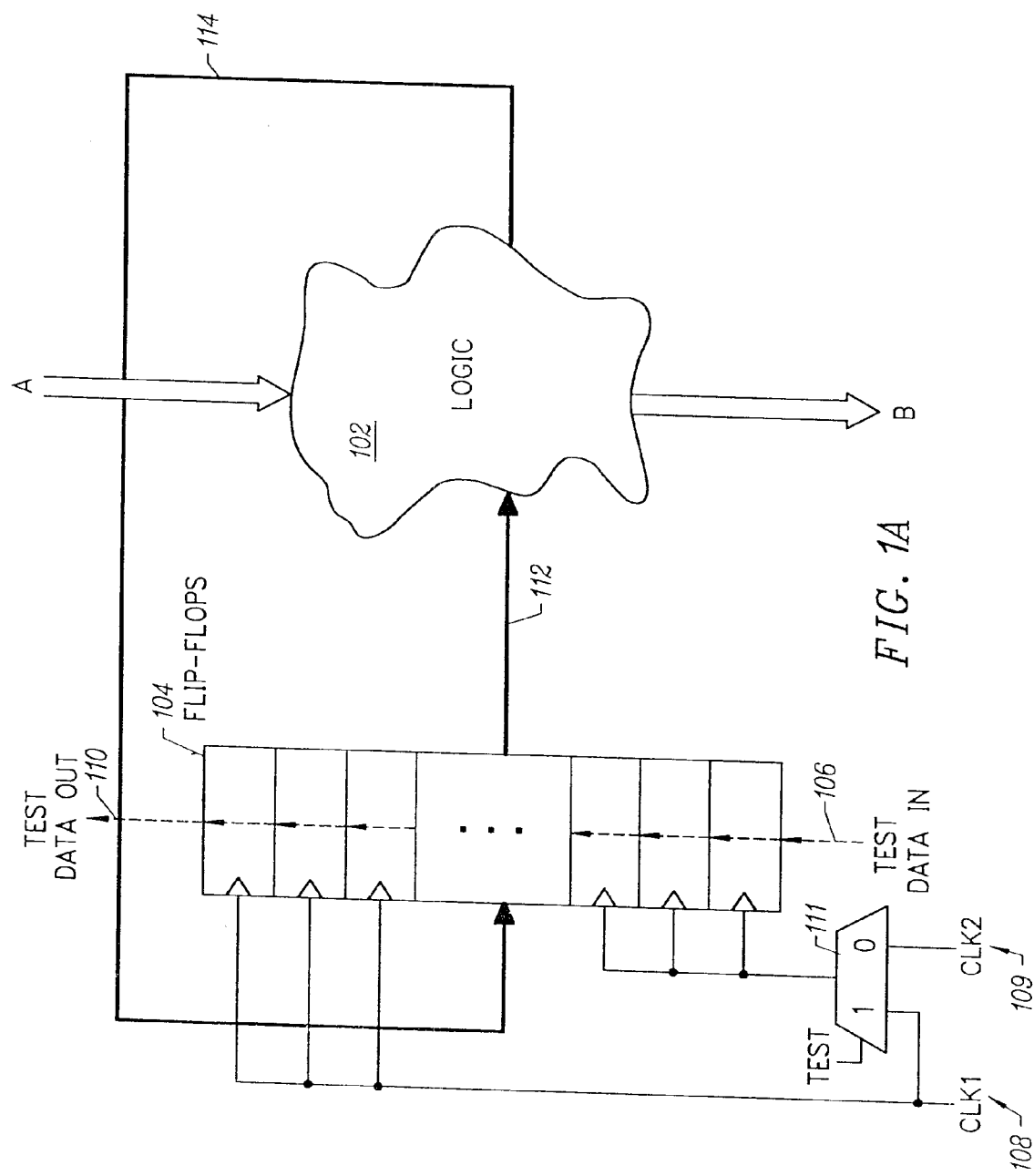
FIG. 1A shows the diagram of FIG. 1 and generally illustrates scan techniques.
Figure 3:
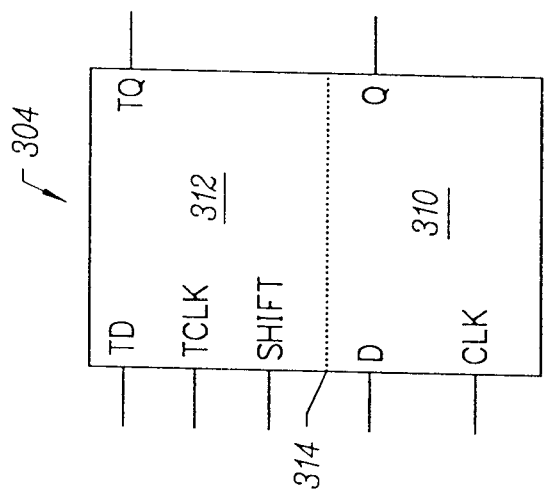
FIG. 3 is a functional block diagram of a device used in clock-based scan.
Figure 2:
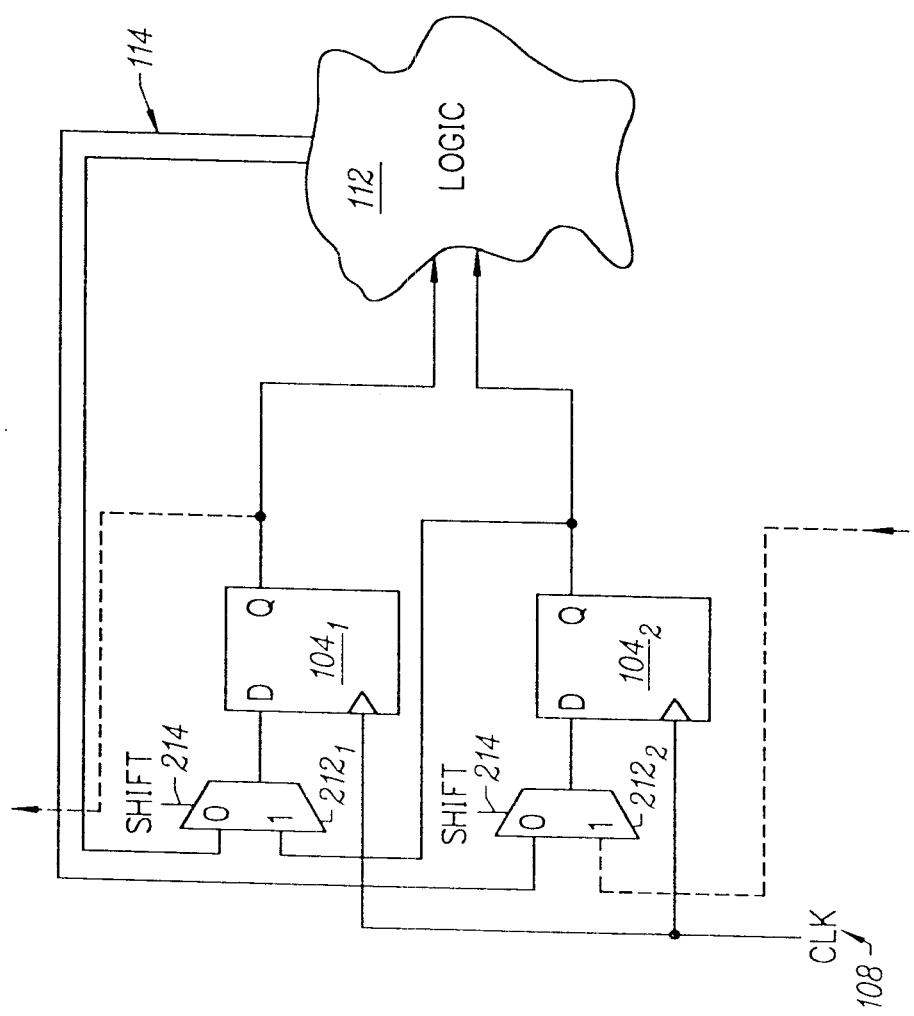
FIG. 2 is a more detailed representation of FIG. 1 when mux-based scan is utilized.

According to traditional thinking with respect to testing integrated circuits, the ability to get good fault coverage in testing a circuit is usually contingent upon insertion of scan flip-flops within the circuit to set and/or store the state of the circuit under test, as previously discussed. Multiplexors must be inserted in front of flip-flops already present in the design as discussed with reference to FIG. 2 or flip-flops must be converted to the dual-interface devices shown and discussed with respect to FIG. 3. If flip-flops already present in the circuit are not adequate to fully test the circuit, additional circuitry (e.g., multiplexors and/or flip-flops) must be added to the circuit solely for test purposes. Thus, when an IC designer desires to implement certain designs in a gate array, some circuitry (e.g., function modules or portions thereof) in the gate array will have to be sacrificed for testing purposes.

In order to test the circuit of FIG. 6 as shown, traditional test structures would need to be utilized. In other words, to use mux-based scan for every STLB 444 in array 410 that implements a flip-flop, other logic in the same or other function blocks 420 will have to be coupled to implement a multiplexor whose output is coupled to the respective flip-flop (e.g., the multiplexor included in one embodiment of stage one logic 442 could be used for such a purpose). To use clock-based scan would be even more complicated. Having to use certain logic to implement structures for testing purposes typically eliminates the ability to use that same circuitry for other purposes.

Nonetheless, a gate array predesigned in accordance with the invention minimizes the sacrifice of all or part of the circuitry of any function block 420 strictly for testing purposes and does so in a way that avoids having to design a user-designed circuit in accordance with conventional DFT rules as described previously. Further, a predesigned gate array in accordance with the invention allows testing of a user-designed circuit without regard to where sequential logic will be placed in the user-designed circuit to be ultimately implemented by the gate array.

In accordance with the invention, although not always ultimately configured to perform a sequential function in normal operation, because the STLB 444 of FIG. 6 can easily be configured to perform sequential functions, i.e., since it includes the ability to store bits, circuitry for enabling testing of the array is placed in each STLB 444. Use of each STLB 444 for testing purposes can actually occur regardless of the underlying type of user-defined circuit functionality (e.g., combinational, sequential) the STLB 444 implements once it has been customized (i.e., by coupling its inputs to various signals). Hence, testing of a circuit implemented by the array in accordance with the invention does not require prior knowledge of the circuit nor involvement of the designer.

Figure 11:
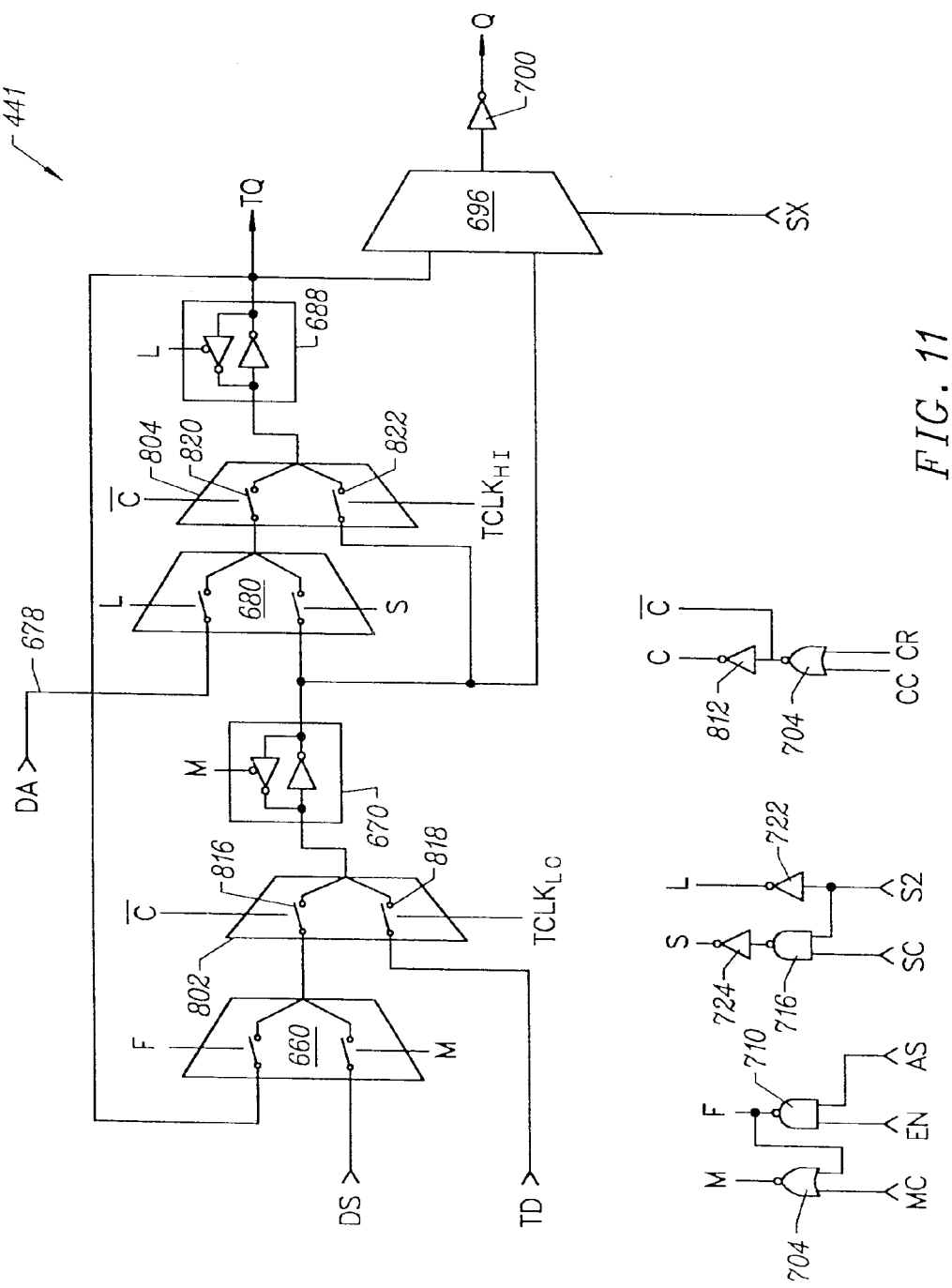
FIG. 11 is the functional block diagram of FIG. 6 further including circuitry to enable testing in accordance with the invention.

FIG. 11 shows FIG. 6 as modified to enable testing in one embodiment of the invention. As shown in FIG. 11, two additional dual-control multiplexors 802 and 804 are added to the circuit of FIG. 6. The output of dual-control multiplexor 660 is coupled to the first input of dual-control multiplexor 802 while the second input of dual-control multiplexor 802 is coupled to receive test data (TD) on line 806. The output of dual-control multiplexor 802 is coupled to bit storage unit 670. Dual-control multiplexor 804 has its first input coupled to the output of dual-control multiplexor 680 and its second input coupled to the output of bit storage unit 670. The output of dual-control multiplexor 804 is coupled to bit storage unit 688.

In addition in FIG. 11, select and enable logic additionally includes NOR gate 814 and inverter 812. NOR gate 814 receives a "cut column" (CC) signal on one input and a "cut row" (CR) signal on a second input. CC and CR are also sometimes referred to herein as a column mode select signal and a row mode select signal, respectively. The output of NOR gate 814 carries signal $\overline{C}$ while the output of inverter 812 carries signal C. Signals C and $\overline{C}$ act as "freeze" indication signals as will be later discussed. $\overline{C}$ is coupled to switch 816 in multiplexor 802 and switch 820 in multiplexor 804. Two additional signals are provided: $TCLK_{LO}$ and $TCLK_{HI}$. $TCLK_{LO}$ is coupled to switch 818 in multiplexor 802 and $TCLK_{HI}$ is coupled to switch 822 in multiplexor 804. TQ, an output from bit storage unit 688, is a test data output.

Figure 12:
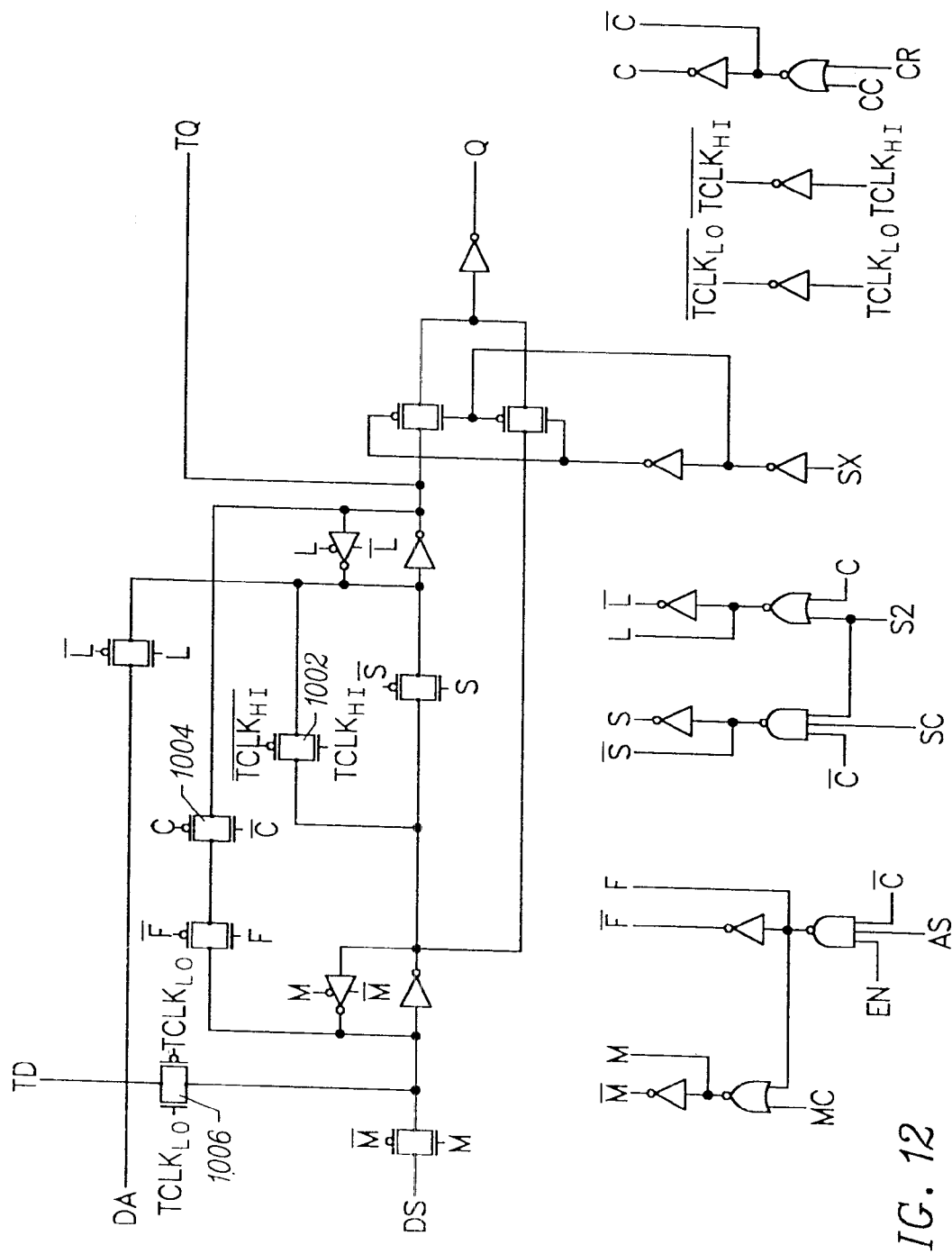
FIG. 12 is a schematic diagram of FIG. 11.

As shown, FIG. 11 represents only the functional operation of the test circuitry. When the circuit is implemented at the transistor level and optimized, however, actual separate implementation of all logic elements shown in FIG. 11 may not be necessary. For instance, FIG. 12 shows one specific implementation of STLB 444 with test circuitry as shown in FIG. 11, where the circuitry in FIG. 12 has been optimized. As can be seen by a comparison to FIG. 7, only slight modifications to the circuit of FIG. 7 need be made in order to implement test circuitry in each STLB 444. Specifically, only three additional transmission gates 1002, 1004, and 1006 have been added in FIG. 12 to obtain the functionality shown in FIG. 11. Some modifications have also been made to select and enable logic. Specific details of FIG. 12 will not be further discussed as they will be clear to one of skill in the art upon a comparison of FIG. 12 with FIG. 11. It should further be clear to one of ordinary skill in the art that, although logic gates and inverters are shown, the logic gates in FIG. 12 and other figures are implemented with various transistor configurations. Moreover, one skilled in the art will recognize in FIG. 12 and other figures that various additions, deletions and/or rearrangements of inverters and/or logic gates will still result in an equivalent circuit.

Referring again to FIG. 11, in operation, when $\overline{C}$ is a logical high (C is a logical low), switches 816 and 820 in multiplexors 802 and 804 are selected, and the circuit behaves in a normal fashion, performing whatever combinational, sequential, or memory function it has been configured to perform as determined by the user-designed circuit. When $\overline{C}$ is a logical low signal (C is a logical high), the STLB 444, is in a freeze mode of operation, freezing (or capturing) the state of the circuit and preventing the bits stored in the STLB from responding to user-designed circuit inputs, and behaves as a master-slave flip-flop. When in a freeze mode of operation ($\overline{C}$ is a logical low), the test clock, TCLK, distributed through the signals $TCLK_{LO}$ and $TCLK_{HI}$, shifts test data from the data input on line TD through bit storage units 670 and 688 and out through TQ. In one embodiment of the invention $TCLK_{LO}$ and $TCLK_{HI}$ are inverse signals to one another, being derived from the same clock (i.e., when $TCLK_{LO}$ is high, $TCLK_{HI}$ is low and vice versa), and both $TCLK_{LO}$ and $TCLK_{HI}$ only distribute TCLK when the array is in a freeze mode of operation, otherwise leaving switches 818 and 822 open.

Figure 13:
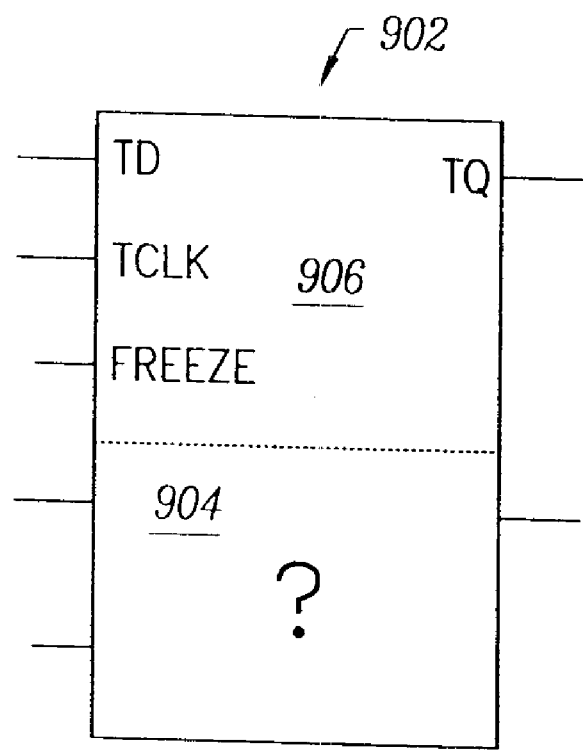
FIG. 13 is a more generalized functional block diagram of the circuit of FIG. 11.

Essentially then and referring to device 902 in FIG. 13, the STLB 444 will behave somewhat like the device 304 (FIG. 3) used in clock-based scan. Like the device of FIG. 3, the device of FIG. 14 also switches between two interfaces. Rather than simply switching between two interfaces for a single flip-flop, however, when the interfaces to the device 902 are switched, the circuitry internal to the device 902 is reconfigured, although the same circuitry is used. As discussed previously, the function of STLB 444 can be varied simply by varying its inputs. Thus, when FREEZE is selected, the circuitry in STLB 444 that implements a user-designed function (e.g., combinational, sequential, or memory) in normal mode, represented by the "?" in the lower portion 904 of the device 902, is reconfigured to implement a master-slave flip-flop, represented in the upper portion 906 of device 902, having test data in (TD), a Test Clock (TCLK) (the clock from which $TCLK_{LO}$ and $TCLK_{HI}$ are derived) and test data out (TQ). When FREEZE is selected by placing a logical high signal on line C (FIG. 11), STLB 444 becomes non-responsive to regular STLB input signals (e.g., DS, DA), so that except for responding to the test clock ($TCLK_{LO}$ and $TCLK_{HI}$) and test data input signal (TD) the two internal bit storage units do not change state.

Addressable Mode Control

In an array 410 of function blocks 420, the STLB 444 of each computation module 440 will be selectable for a normal mode of operation or for a freeze mode of operation by selecting the appropriate column and row mode select signals for the STLB 444. In other words, in the array 410, the STLBs 444 form a sub-array where each STLB 444 is addressable by row and column. The column (CC) and row (CR) signals together produce signal C, determining if the STLB is in freeze mode or normal mode. If the column and row mode select signals for the module are both a logical low signal, the STLB will operate in normal mode, performing whatever function (e.g., combinational, sequential, memory) the STLB 444 is configured to perform by the user-designed circuit. If either of the column or row mode select signals is a logical high, then the STLB is in freeze mode. Thus by deasserting both column and row mode select lines, the behavior of any one STLB 444 can be selected for testing in normal mode.

Figure 14:
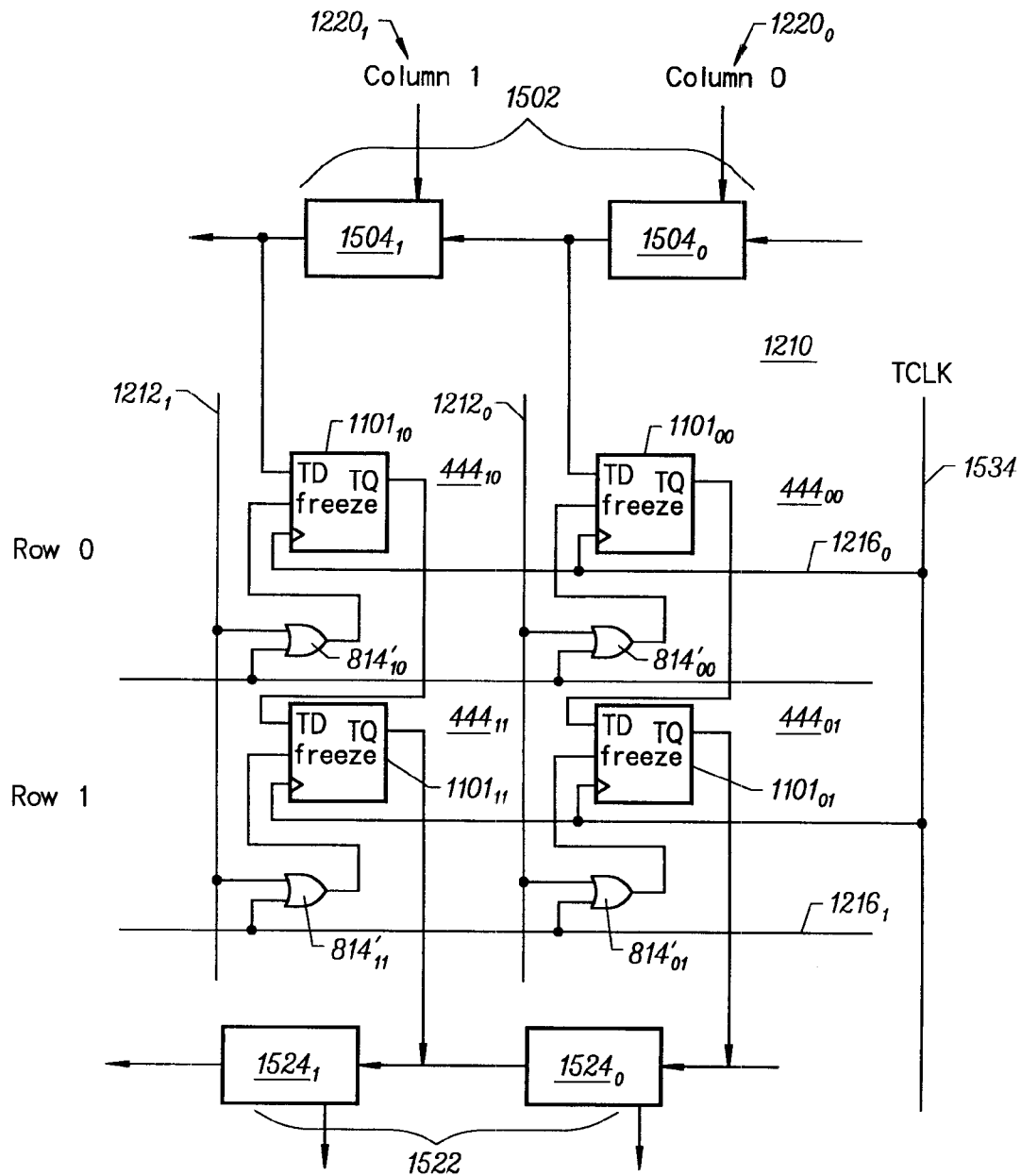
FIG. 14 is a functional block diagram of an array in accordance with the invention.

For instance, FIG. 14 shows a portion of the sub-array 1210 formed by the STLBs $444_{ij}$ of array 410 (stage one logic blocks 442 and communication modules 460 are not shown in FIG. 14) illustrating the STLBs as flip-flops (i.e., if referring to FIG. 13, the upper interface 906 for each STLB is illustrated). NOR gate 814 and inverter 812 are shown in FIG. 14 simply as OR gate 814' having one input coupled to a column mode select line $1212_i$ and a second input coupled to a row mode select line $1216_j$. By placing a logical low on each of Column 1 Mode Select line $1212_1$ and Row 1 Mode Select line $1216_1$, and by placing logical high values on each of Column 0 Mode Select line $1212_0$ and Row 0 Mode Select line $1216_0$, only STLB $444_{11}$ is selected to operate in normal mode. STLBs $444_{00}$, $444_{01}$, and $444_{10}$ will be frozen, retaining as stimulus data that data that was shifted in while all STLBs were frozen. STLB $444_{11}$ will compute the result of whatever stimulus data it receives, e.g., from STLBs $444_{00}$, $444_{01}$, and $444_{10}$ and then capture the result when it is frozen by lines $1212_1$ and $1216_1$ being asserted. Thus, any STLB $444_{ij}$ can be selectively addressed and tested for proper operation in normal mode. This ability to select any one STLB for exercise during testing of a circuit implemented by the array 410 is sometimes referred to herein as "addressable mode control."

Testing

In order to control the state of the circuit implemented by an array 410, stimulus values are placed in all STLBs in the array 410. To do so, the flip-flops in each column $1220_i$ of STLB sub-array 1210 are "daisy-chained" together. Referring to FIG. 14, in Column 1 $1220_1$, stimulus values are first input into flip-flop $1101_{10}$ in STLB $444_{10}$. The Q output of flip-flop $1101_{10}$ is coupled to the D input of flip-flop $1101_{11}$. The daisy-chain continues to the bottom of the column $1220_1$. Likewise, the flip-flops of STLBs in Column 0 $1220_0$ (e.g., STLBs $444_{00}$ and $444_{01}$) would be similarly daisy-chained.

To place the circuit into a known state, all rows and columns are first selected to freeze by applying logical high values to all of the row freeze lines $1216_j$ and/or all of the column freeze lines $1212_i$. Stimulus values are placed in a shift register 1502, where the output of each stage $1504_i$ of the shift register 1502 is coupled to the TD input of the first flip-flop $1101_{i0}$ in each column, in one embodiment of the invention. Applying a test clock (TCLK) 1534, test stimulus values are applied one at a time, from shift register stages $1504_i$ to the respective daisy-chains where they are simultaneously shifted through each column $1220_i$ via the daisy-chains. A selected STLB $444_{ij}$ would then be selected for normal mode operation by placing a logical low value on both of the row and column freeze lines corresponding to the selected $STLB_{ij}$.

Likewise, to observe the result of a circuit under test, the array of flip-flops, and particularly those in the STLB having just been selected for normal mode, would be frozen via the appropriate row and/or column mode select lines and the resulting data shifted out, again by applying TCLK 1534. The resulting values are shifted into shift register 1522, in one embodiment of the invention, from which the values are shifted out of the IC and observed. Other embodiments of the invention may shift data into or out of one column at a time rather than all columns simultaneously and/or may not require use of shift registers 1502, 1512. In one embodiment, as shown, when shift registers are included, the shift registers allow for both serial and parallel test data access to the array.

Partition Test

Generally, when testing a circuit with one test method in accordance with the invention, STLBs 444 that are connected together in the user-designed circuit should not be tested simultaneously. As discussed above, each STLB can be selectively addressed to operate in normal mode while other STLBs simultaneously remain in freeze mode. Still, testing one STLB block 444 at a time is inefficient and time consuming, particularly when there may be thousands of STLB blocks 444 on a single IC. Testing each STLB block individually would entail repeatedly freezing all STLBs, shifting in test stimulus values, exercising the one STLB selected (i.e., placing the selected STLB in normal mode by de-asserting C), and shifting out all the resulting values from the STLBs.

To avoid the above scenario, in one method of testing a gate array in accordance with the invention, herein referred to as "partition test," the circuit is partitioned to test simultaneously as many STLBs 444 as possible that are not "adjacent". STLBs 444 are considered to be "adjacent" if the output from one will influence the state of the other. For instance, two STLBs are "adjacent" if (1) there are connection lines directly from the Q output of one STLB to any input of a second STLB (except SX, because SX will not cause any change in values stored in the bit storage units), or (2) there is a connection such as in (1) but with the additional interposition of combinational logic from stage one logic 442, inverter stage logic 464, driver stage logic 462, or a combinational SX-to-Q path through an STLB.

Figure 23:
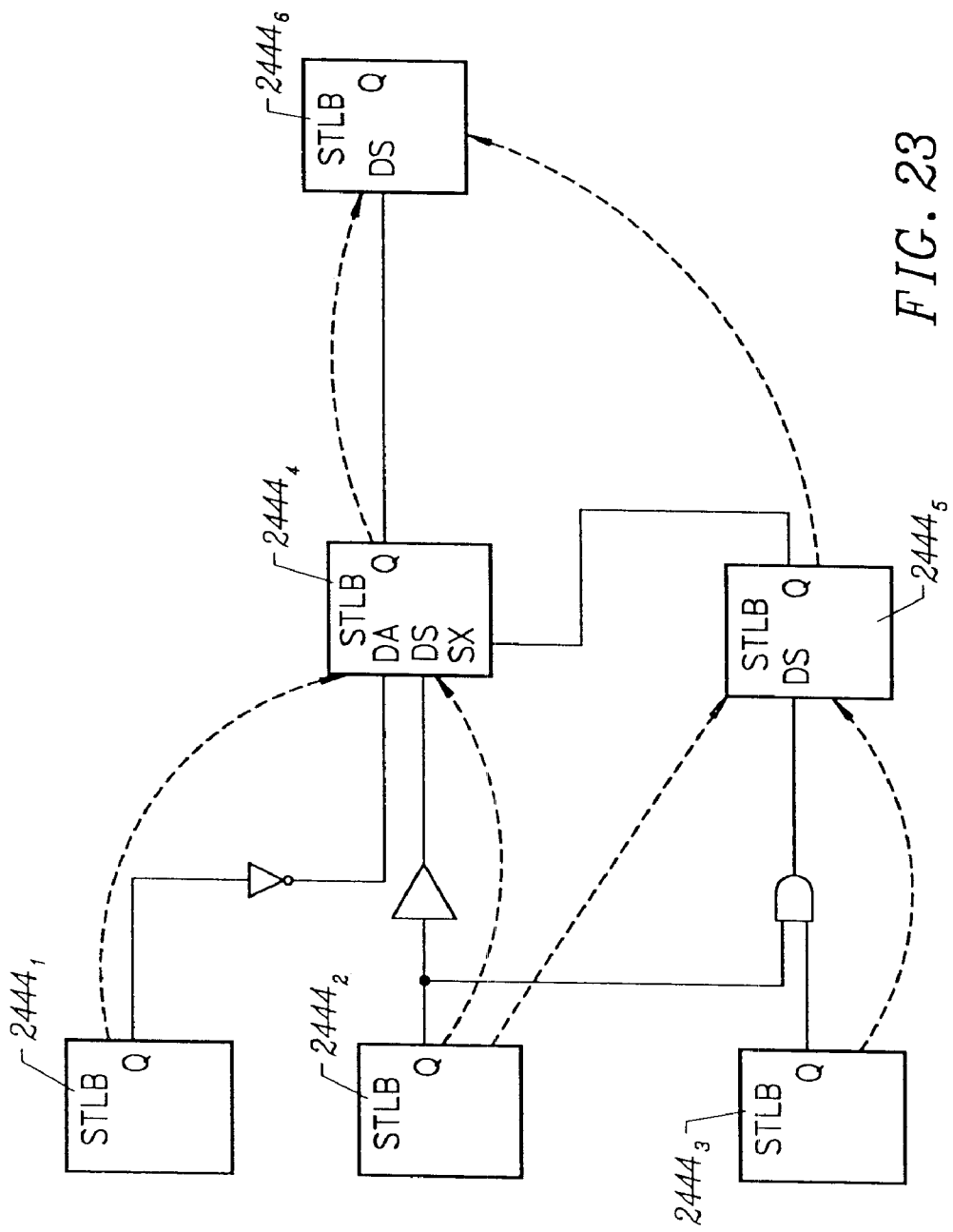
FIG. 23 is a block diagram illustrating "adjacent" and "nonadjacent" STLBs.

By way of example, FIG. 23 shows six STLBs $2444_{1-6}$ connected in a user-designed circuit as indicated by solid lines. The dashed lines indicate which STLBs are "adjacent". STLB $2444_1$ is adjacent to STLB $2444_4$ as there is only an inverter between the two STLBs. STLB $2444_2$ is adjacent to STLB $2444_4$ and STLB $2444_5$ as there is only driver logic and combinational logic between the STLBs, respectively. Likewise, STLB $2444_3$ is adjacent to STLB $2444_5$. STLB $2444_4$ is directly connected to STLB $2444_6$ and is thus adjacent. Finally, STLB $2444_5$ is adjacent to STLB $2444_6$ as it is connected via the SX input of STLB $2444_4$, causing only combinational logic to reside between the two.

A first partition is determined that includes the maximum set of STLBs 444 that are not adjacent, such as STLBs $2444_1$, $2444_2$, $2444_3$, and $2444_6$ in FIG. 23. After shifting in appropriate stimulus values as described above, all the STLBs 444 in the partition are exercised (placed in normal mode) while the rest of the STLBs 444 in the array are left frozen to maintain the stimulus data. Once the STLBs of the first partition are tested (including exercising and shifting out the resulting captured values), then a next partition is tested, such as $2444_4$ and $2444_5$. The partitions are determined by graph coloring techniques that are generally known in the art.

Figure 15:
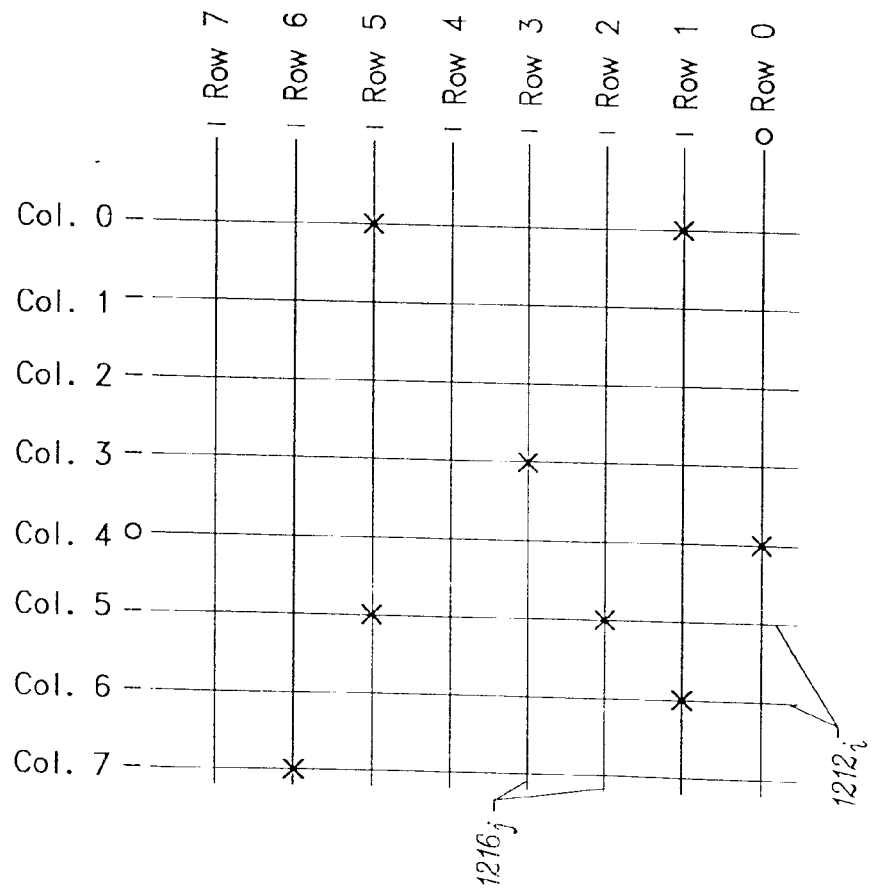
FIG. 15 is a block diagram representation of an array in accordance with the invention when using partition test.

More specifically with reference to partition test, FIG. 15 shows a slightly larger portion of the sub-array 1210 of STLBs 444, with column mode select lines $1212_i$ and row mode select lines $1216_j$, where there is an STLB at each intersection. The logic for each STLB is not shown for clarity of illustration. As shown, only those STLBs shown with an "X" are part of an exemplary first partition and are to be exercised, as these modules will not influence one another during the testing process (they are "nonadjacent" to one another in the user's design (not shown)). To test those STLBs 444 that are part of the partition shown in FIG. 15, first, all of the STLBs in array 1210 are frozen, e.g., logical highs are applied to all row mode select lines $1216_j$ and/or all column mode select lines $1212_i$, to cause the STLBs to function as daisy-chained flip-flops. Next, stimulus data is shifted into all of the STLBs in a columnar daisy-chain fashion as described with respect to FIG. 14 by application of TCLK, and herein referred to as a "shift operation." A shift operation can take place, in accordance with one embodiment of the invention, only after the STLBs have been frozen.

Once the shift operation has completed, a partition mask is applied. A partition mask will cause only the selected STLBs (marked with an "X") to exercise normally, while other STLBs will remain frozen, driving out stimulus values. The partition mask is applied one row at a time. To do so, mode selection values are applied to the column mode selection lines $1212_i$ so that logical low values appear only on the columns in the first row where an STLB is to be exercised. Mode selection values are also applied to the row mode selection lines $1216_j$ so that only one row, the first row, has a logical low value. So, in the example of FIG. 15, Row 0 is to be tested first. The values applied to Columns 7:0 would be 11101111 and the values applied to Rows 7:0 would be 11111110, in order to exercise only the STLB in Row 0 at Column 3. Once the selected STLBs in the Row 0 have been exercised, the selected STLBs in Row 1 will be exercised in a similar manner, e.g., by applying a mask of 10111110 to Col 7:0 and applying a mask of 11111101 to Row 7:0. Note that while only one Row is selected to exercise at a time, more than one column may be selected in various embodiments of the invention. As will be recognized by those of skill in the art, other embodiments of the invention can select more than one row at a time while selecting only one column at a time. The cycle repeats for each row until all selected STLBs in all rows have been exercised. Once all STLBs in all rows have been exercised for the partition, all STLBs are again frozen. Then, a shift operation is performed, by applying TCLK and shifting out the data captured in columnar daisy-chain fashion for observation. A new partition is then selected and the procedure is repeated: stimulus data is shifted in, selected STLBs are exercised row by row, and captured data is shifted out. Several partitions may be required so that each STLB is exercised at least once. The inventors of the present invention have found that for a gate array having approximately 40,000 function blocks designed in accordance with the invention, approximately a dozen partitions will be required on average to fully test array 410.

Scan Emulation Test

Using an embodiment of the invention as described with respect to FIG. 14, the array of STLBs can also be used to emulate traditional scan testing, herein referred to as "scan emulation test". To do so, first stimulus data would be shifted into all STLBs as discussed above for partition test, i.e., by applying 1's to all column mode select lines and/or all row mode select lines to freeze all STLBs and then applying TCLK to shift data in. Next, rather than selecting a partition, all STLBs are simultaneously exercised, i.e., all column mode select lines and all row mode select lines are set to 0. Thus, in scan emulation testing, all STLBs are either frozen to accept stimulus data (or to shift out resulting data) or all STLBs are in normal mode.

Figure 16:
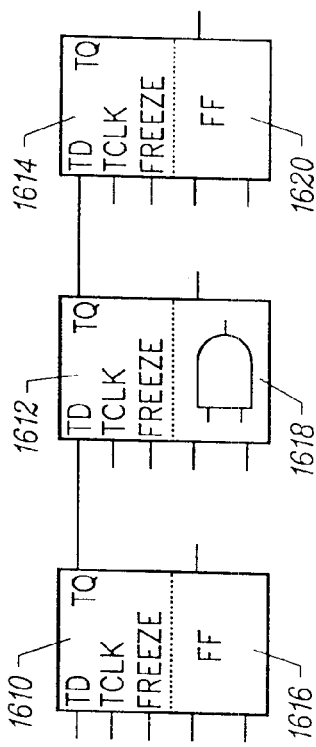
FIG. 16 is a block diagram showing that during scan emulation testing, extra bits of data, that would not be present in traditional scan techniques, may be present when using an array in accordance with the invention.

In this manner, all flip-flops that are used in the circuit will be used for testing, just as in traditional scan techniques. When a system in accordance with the invention is used for scan emulation testing, it will appear to the user to be somewhat like clock-based scan. However, when an STLB is configured, according to the user-designed circuit, to implement in normal mode something other than a sequential function, e.g., a combinational function, an extra bit in addition to that expected for traditional scan will occur in the shifted-in and shifted-out data since all STLBs, regardless of the function they implement in normal mode, will operate as flip-flops while frozen during scan emulation testing in accordance with the invention. Referring to FIG. 16, the daisy-chained test flip-flops 1610, 1612, and 1614 maybe in STLBs that in normal mode operate as a flip-flop 1616, an AND gate 1618, and a flip-flop 1620. In traditional scan, a tester would not expect to be able to place a bit in the STLB containing AND gate 1618 (combinational logic). Once recognized, an extra bit can be inserted into test vectors and/or the extra bit appearing in results can be ignored to enable evaluation in accordance with scan techniques.

Enhanced Shift Operation

As will be recognized by those of skill in the art, in conventional techniques, including scan techniques, the flip-flops in the user's design frequently cannot be easily tested without adding additional clock steering circuitry since flip-flops are edge triggered devices and test stimulus data can only generate static patterns. For instance, referring again to FIG. 10, the master latch 740 loads (is transparent to) data incoming on its D input 732 while the clock input 734 is low. After the rising edge of the clock signal, data is captured in the slave latch 750, which loads when the clock signal is high. Because the flip-flop only responds to clock edges, the internal operation of the flip-flop 730 cannot be easily tested with traditional techniques without additional test structures. For instance, when the clock signal is a static logical low, whatever value is on the D input 732 to the master latch 740 is loaded, but nothing will load into the slave latch 750. Since only the Q output 736 of the slave latch 750 is observable in traditional scan techniques, the effect of any changes solely to the master latch 740 are not observable. When the clock signal is a static logical high, the master latch 740 will not load—only the slave latch 750 will load the master latch 740 output. Unfortunately, shifting the test data has already loaded the slave from the master so the slave load will have no observable result. Any defects manifesting as faults internal to each flip-flop, therefore, will not be easily isolated with traditional techniques unless care is taken to maintain adequate external controllability of clock signals in order to introduce clock edge transitions from outside the circuit.

Nonetheless, using a system clocked by a single TCLK in accordance with the invention, the master and slave latches can each contain independent values during shift operation. In other words, the flip-flop latches can be fully controlled and observed using only logical low and logical high levels, without requiring clock edges. Moreover, when the STLB is configured to perform a memory function in a normal mode of operation, the two latches store independent memory bits, and therefore it is desirable that they be independently controlled and observed during test.

Figure 17:
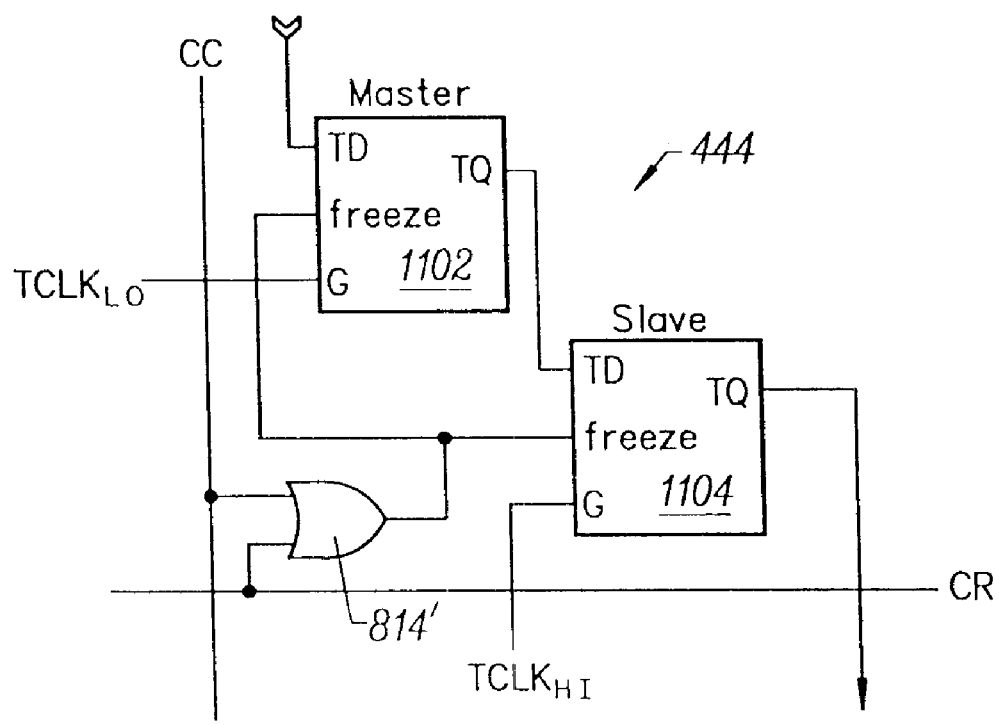
FIG. 17 is a block diagram of an STLB broken into master and slave latch.

FIG. 17 shows use of the STLBs $444_{ij}$ of FIG. 14 redrawn to show the master latch 1102 and the slave latch 1104 of the flip-flop 1101. Master latch 1102 can generally be identified with bit storage unit 670 (FIG. 11) and slave latch 1104 can generally be identified with bit storage unit 688 (FIG. 11).

To shift independent values into each master and slave latch, a system in accordance with the invention separately gates TCLK to each master and slave latch. $TCLK_{LO}$ and $TCLK_{HI}$ are the signals derived from TCLK once gated. More details will be described with respect to FIG. 18.

Figure 18:
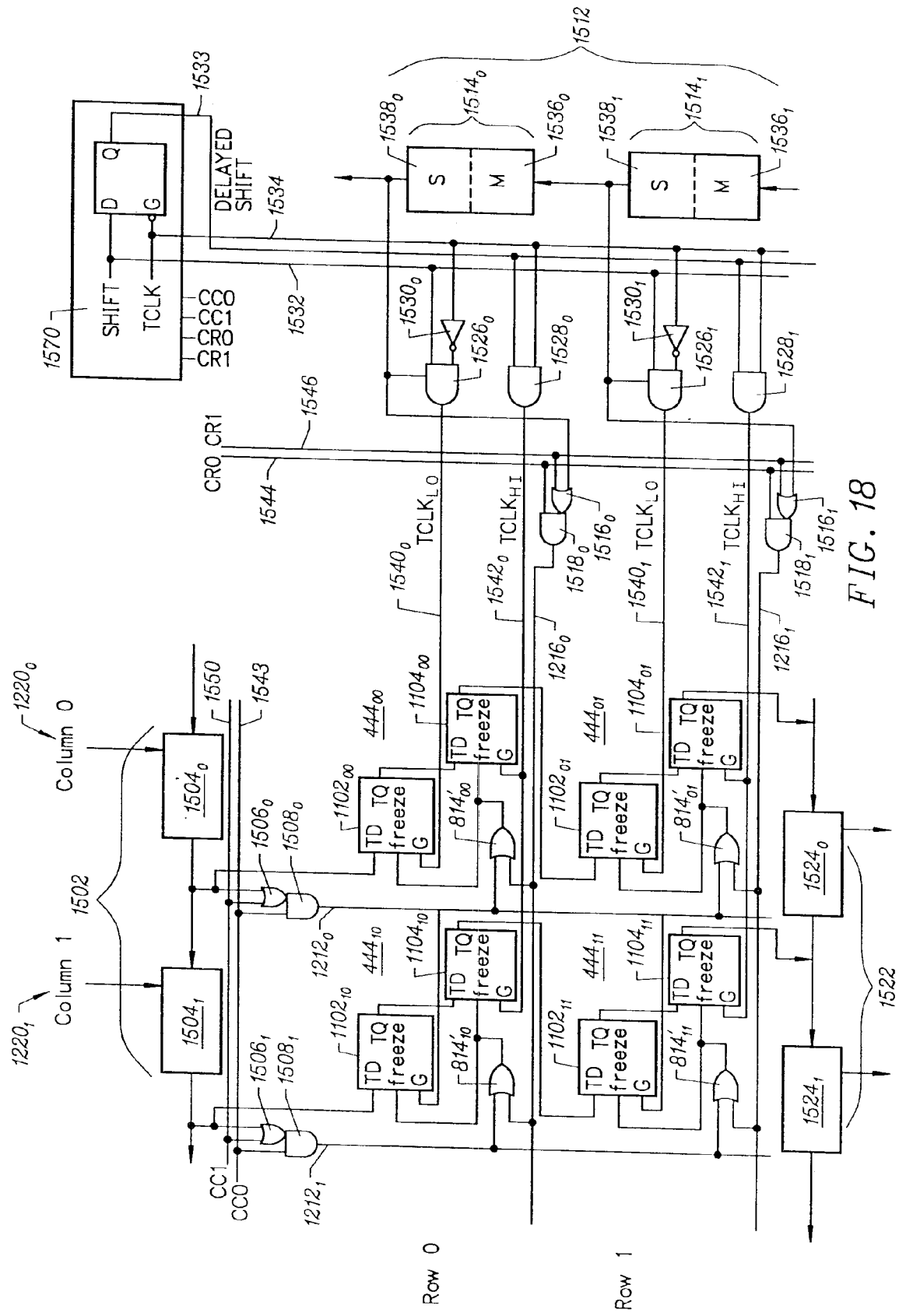
FIG. 18 is a functional block diagram of an array, including test support circuitry, in accordance with the invention.

Referring now to FIG. 18, a more detailed block diagram of a system in accordance with the invention is described. Similar to that shown in FIG. 14, a 2×2 array of STLBs ($444_{ij}$) is shown in FIG. 18 drawn to show the master and slave latch of each flip-flop. The flip-flops, and thus the latches, are daisy-chained together as described with respect to FIG. 14. Each STLB $444_{ij}$ has an OR gate $814'_{ij}$ coupled to a respective row mode select line $1216_j$ and a column mode select line $1212_i$. The output "C" of each respective OR gate, $814'_{ij}$ is coupled to the FREEZE inputs of each of the master latch $1102_{ij}$ and slave latch $1104_{ij}$ for the respective STLB.

In addition, various test support logic is shown. Such logic would appear in one embodiment of the invention in periphery region 430 of ASIC 400 (FIG. 4). Test support logic includes shift register 1502, shift register 1512, shift register 1522, and test controller 1570.

Shift register 1502 is composed of flip-flops $1504_i$. Each stage of the shift register, i.e., each flip-flop $1504_i$, is coupled to the data input of the respective master latch $1102_{ij}$ in the first row (Row 0) of the respective column. For example, flip-flop $1504_0$ is coupled to the TD input of master latch $1102_{00}$. Likewise, flip-flop $1504_1$ is coupled to the test data input of the master latch $1102_{10}$.

Each flip-flop $1504_i$ in shift register 1502 is further coupled to the input of an OR gate $1506_i$. The second input to each OR gate $1506_i$ is coupled to CC1. The output of each OR gate $1506_i$ is coupled to the first input of an AND gate $1508_i$. The second input to each AND gate $1508_i$ is coupled to the CC0 line. The output of each AND gate $1508_i$ is the column mode select signal (CC) $1212_i$.

A shift register 1522, including flip-flops $1524_j$, is further included. Each flip-flop $1524_j$ is coupled to receive the TQ output of the slave latch $1104_{ij}$ in the last row of each column.

Test support logic for the rows also includes a shift register and combinational logic similar to that provided for the columns. More specifically, a shift register 1512 is composed of master-slave flip-flops $1514_j$. Each stage of the shift register, i.e., each flip-flop $1514_j$, is coupled to the input of an OR gate $1516_j$. The second input to each OR gate $1516_j$ is coupled to CR1 1546. The output of each OR gate $1516_j$ is coupled to the first input of an AND gate $1518_j$. The second input to each AND gate $1518_j$ is coupled to CR0 1544. The output of each AND gate $1518_j$ is the row mode select signal (CR) $1216_j$.

Clock control logic is further provided. Clock control logic includes, for each row, an AND gate $1526_j$, AND gate $1528_j$, and an inverter $1530_j$. Each AND gate $1526_j$ has a first input coupled to a SHIFT signal line 1532 and a second input coupled to inverter $1530_j$. The input of inverter $1530_j$ is coupled to a TCLK signal line 1534. The output of each AND gate $1526_j$ produces $TCLK_{LO}$ and is coupled to the G input of each master latch $1102_{ij}$ in its respective row. Each AND gate $1528_j$ is coupled to DELAYED SHIFT signal line 1533. The second input to each AND gate $1528_j$ directly to the TCLK signal line 1534. The output of AND gate $1528_j$ provides $TCLK_{HI}$ and is coupled to each slave latch $1104_{ij}$ in its respective row.

To obtain the DELAYED SHIFT signal on line 1533, SHIFT 1532 is coupled to the D input of latch 1535, while the gate of latch 1535 is coupled to TCLK 1534. The Q-output of the latch 1535 is coupled to the DELAYED SHIFT signal line 1533. In one embodiment, this latch 1535 would be part of a test controller 1570 that controls all of the test signals in FIG. 18 (e.g., CC0, CC1, CR0, CR1, TCLK, SHIFT, and DELAYED SHIFT).

Each AND gate 1526$_j$, 1528$_j$ further includes an enable input (which may actually be a third input in a 3-input AND gate). The enable input to each AND gate 1526$_j$ is coupled to the Q-output of each slave latch 1538$_j$ (i.e., the Q-output of each flip-flop 1514$_j$). The enable input to each AND gate 1528$_j$ is coupled to the Q-output of each master latch 1536$_j$.

Unlike in traditional testing methods where a single value is captured by the master-slave flip-flop, by utilizing clock control logic, independent values can be shifted into and out of each master latch 1102$_{ij}$ and slave latch 1104$_{ij}$, thereby operating in an "enhanced shift operation." For instance, when shifting test stimulus values into each column, the shift register 1502 is used to provide the respective test data. Once the data is shifted through the column into the appropriate latch, the clock to that row of latches is turned off. For example, data values can be shifted into the latches until the appropriate data value reaches a chosen slave latch 1104$_{ij}$. Then TCLK$_{HI}$ to that slave latch is turned off. On the next shift through the latches, an independent data value can then be shifted into the master latch for the same STLB. Then TCLK$_{LO}$ to that master latch can be turned off. Other latches in the column, whose TCLK$_{LO}$ or TCLK$_{HI}$ signals have not been turned off, will continue to shift. In this manner, independent values can be placed in each of the master and slave latches for all STLBs in the array.

More specifically and by way of example, in FIG. 18 during a shift operation, shift register 1512, also clocked with TCLK, is first loaded with all logical high values, enabling TCLK to be distributed to all TCLK$_{LO}$ and TCLK$_{HI}$ signals in the array. When a desired value for slave latch 1104$_{01}$ has been shifted through Column 0 so that it has been shifted into slave latch 1104$_{01}$, then the TCLK$_{HI}$ 1542$_1$ for Row 1 is turned off by shifting a logical low value into the master latch 1536$_1$, disabling AND gate 1528$_1$. On the next shift of stimulus values through Column 0, an independent value will be shifted into master latch 1102$_{01}$ and the slave latch 1538$_1$ will receive a logical low, disabling AND gate 1526$_1$ and thereby turning off TCLK$_{LO}$ 1540$_1$ to the master latches 1104$_{i1}$ in Row 1. Logical low values are shifted progressively through the master and slave latches of shift register 1512, disabling the TCLK$_{LO}$ and TCLK$_{HI}$ signals one by one for each row until all the signals 1540$_j$ and 1542$_j$ to each of the master and slave latches 1102, 1104 have been turned off.

To observe the data in both the master and slave latches 1102$_{ij}$, 1104$_{ij}$ independently, a similar mechanism is used to shift data out of the array. First, shift register 1512 is loaded with logical low values, preventing the distribution of TCLK to TCLK$_{LO}$ and TCLK$_{HI}$ in all of the rows. Then, logical high values are progressively loaded into the shift register 1512. For instance, the first logical high value will be loaded into master latch 1536$_1$, enabling AND gate 1528$_1$ and turning on TCLK$_{HI}$ in Row 1. The data stored in the slave latches 1104$_{i1}$ in Row 1 will be shifted out to register 1522. A logical high value is then received in slave latch 1538$_1$, enabling AND gate 1526$_1$, and thus TCLK$_{LO}$ in Row 1. Data stored in the master latches 1102$_{i1}$ in Row 1 will be shifted out (via the Row 1 slave latches) and received by shift register 1522. Each TCLK$_{HI}$ and TCLK$_{LO}$ is sequentially enabled. At the time all of them have been enabled, half of the data will have been shifted out of the array. The remaining half of the data is shifted out with all enabled, i.e., with TCLK gated onto each row.

In FIG. 18, CR0 1544, CR1 1546, CC0 1548, and CC1 1550 are mode lines that determine the operating mode of the array. For instance, when all of the mode lines are a logical low, the circuit operates in normal mode (no STLB is frozen). If CC0 and CC1 are both logical high's (and/or if CR0 and CR1 are both logical high's), the array is in freeze mode and can, by assertion of TCLK, perform a shift operation or an enhanced shift operation—shifting test stimulus values into or out of the array. If CC0 is a logical high, CC1 is a logical low, CR0 is a logical high, and CR1 is a logical low, the STLBs are enabled for addressable mode control: values shifted into the shift registers 1502 and 1512 will control which STLBs are to be in freeze mode and which are to operate in normal mode.

Note that shift registers 1502 and 1512 serve multiple purposes. Shift register 1502 is used to shift in stimulus values in a shift operation, but, once stimulus values are shifted into the STLBs, then the shift register can be used for other purposes, e.g., for addressable mode control. Likewise, shift register 1512 is used for clock control during shift operation, but subsequent to the completion of shift operation, shift register 1512 can also be used for addressable mode control.

As described with reference to FIG. 5, other logic may form part of any circuit formed from array 410. For instance various combinational circuits (e.g., stage one logic blocks 442 or inverter stages 464) may lie between any STLBs 444. Nonetheless, the inventors have found that when using and designing circuits in accordance with their invention, typically only 3–4 non-STLB stages will be linked together and that ¼ to ⅓ of all logic used is mapped into the STLBs of a function block 420 in accordance with the invention. Thus, using a system in accordance with the invention for implementing test circuitry and testing a gate array will easily achieve good fault coverage without user design modifications.

As should be understood by those of skill in the art, while an array is formed by function blocks 420, an array is also formed by STLBs 444. The term "sub-array" as used herein is only used for clarity of description and should not be construed to limit the invention. As should also be understood, an array in accordance with an embodiment of the invention could be formed completely with logic blocks formed in accordance with the principles described with respect to STLBs and without other interspersed logic such as stage one logic, inverter stages or driver stages.

Tri-state Contention Prevention

Figure 19:
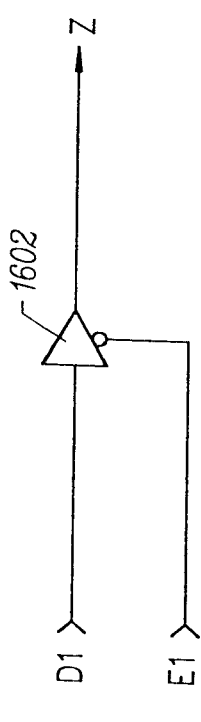
FIG. 19 is a functional block diagram of a tri-state driver stage 462 in accordance with the invention.

Nevertheless, if driver stages 462 are included, an embodiment of a system in accordance with the invention further prevents signals driven by such driver stages 462 from fighting with one another during a shift operation. FIG. 19 shows an embodiment of the driver stage 462 of communication module 460. Tri-state buffer 1602 receives signal DI as a first input and produces signal Z. Tri-state buffer 1602 further receives signal EI to its enable input.

Figure 20:
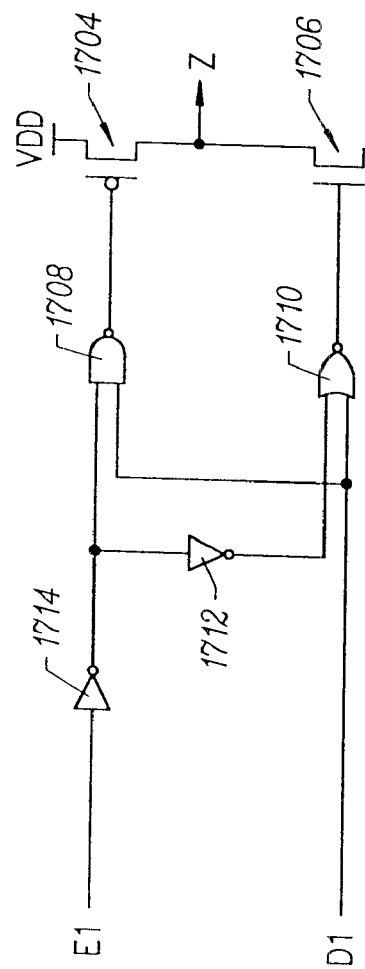
FIG. 20 is a schematic drawing of the circuit shown in FIG. 19.

FIG. 20 is a more detailed drawing showing a specific implementation of an embodiment of driver stage 462 shown in FIG. 19. Tri-state buffer 1602 is implemented with p-channel transistor 1704, n-channel transistor 1706, NAND gate 1708, NOR gate 1710, and inverters 1712 and 1714. Signal EI is input to inverter 1714 whose output is coupled to one input of NAND gate 1708 and to inverter 1712. The output of inverter 1712 is coupled to one input of NOR gate 1710. Input signal DI is coupled to the second input of NAND gate 1708 and the second input of NOR gate 1710. The output of NAND gate 1708 is coupled to the gate of transistor 1704. The output of NOR gate 1710 is coupled to the gate of transistor 1706. The drain of transistor 1704 is coupled to the drain of transistor 1706, forming output Z.

Figure 21:
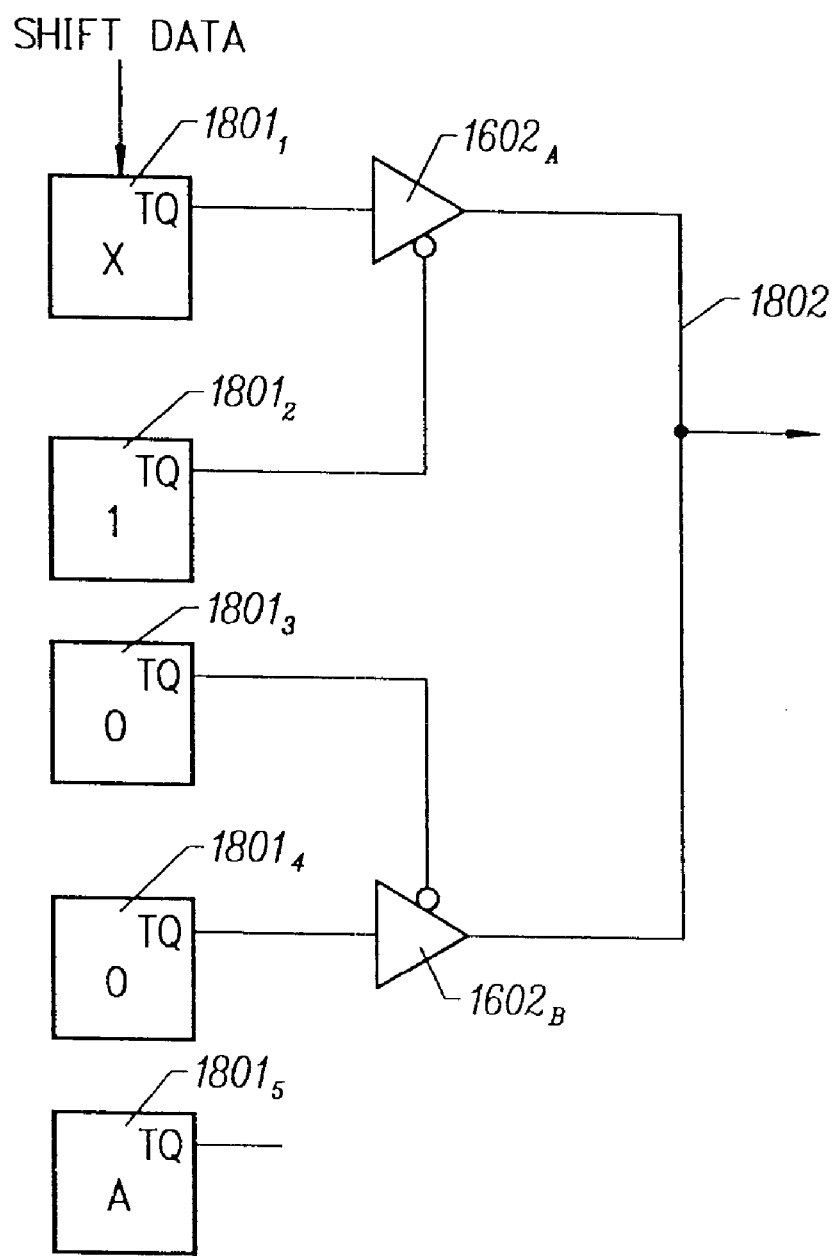
FIG. 21 is a block diagram illustrating potential contention on tri-state driver outputs during shift mode.

FIG. 21 shows two tri-state drivers $1602_A$ and $1602_B$, such as that shown in FIG. 19, where the outputs of the drivers are coupled together on line 1802 and where each tri-state driver has each of its inputs coupled to a respective flip-flop $1801_j$ (i.e., from an STLB) when the STLBs are frozen. Although not shown for purposes of clarity of the figure, flip-flops $1801_j$ are coupled in a daisy-chain manner when the STLBs are frozen (in normal mode, and as has been discussed throughout the detailed description, the respective STLBs may perform a function other than the sequential function shown). Suppose that it is desirable to test the ability of tri-state driver $1602_B$ to drive out a logical low value on line 1802. To do so, the pattern (X100) shown within the flip-flops $1801_{1-4}$ would need to be shifted into the flip-flops, where X is a "don't care" value. The value A (either a logical high or a logical low) will be shifted into flip-flop $1801_5$, the next flip-flop in the column. However, on the clock shift immediately prior to the final clock shift, which shifts in the described pattern, the flip-flops will hold the pattern 100A: both tri-state drivers $1602_A$ and $1602_B$ will be enabled and they will cause contention on line 1802 if A≠1, which will be true 50% of the time.

Figure 22:
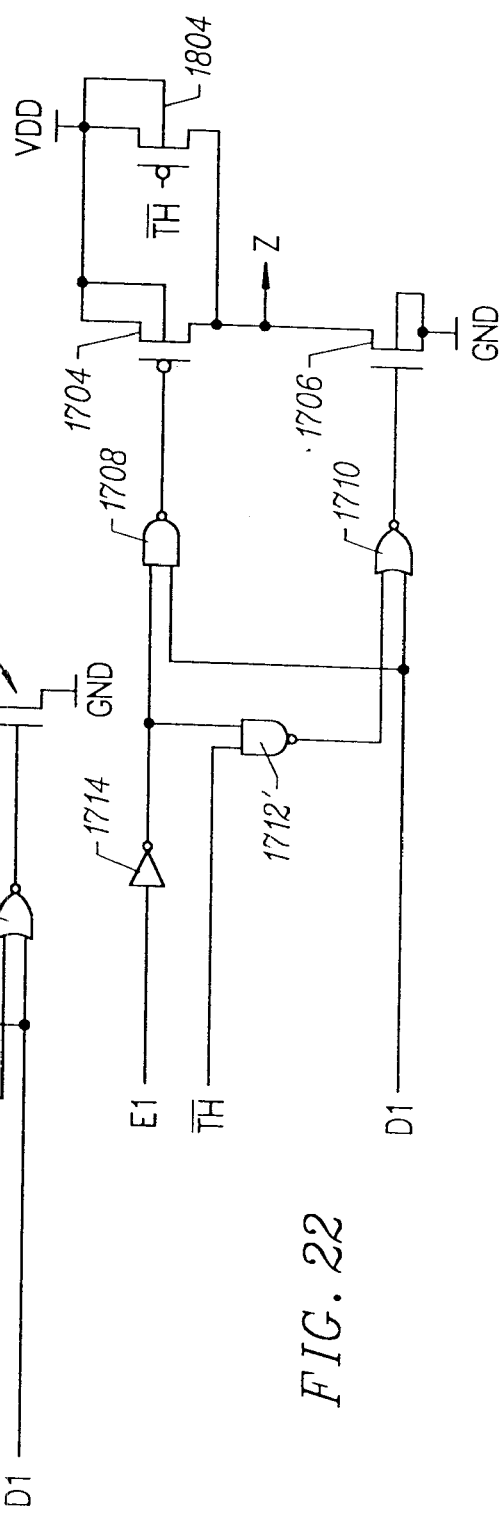
FIG. 22 is the circuit shown in FIG. 20 with additional circuitry added to prevent tri-state contention during shift.

In accordance with an embodiment of the invention, to prevent contention, during a shift operation, all tri-state outputs are held to a logical high value. FIG. 22 shows an additional input $\overline{TH}$ added to the circuit of FIG. 20. Inverter 1712 (FIG. 20) is replaced with NAND gate 1712' and receives as one input $\overline{TH}$ and as a second input, the output from inverter 1714. An additional p-channel transistor 1804 is coupled in parallel to transistor 1704. The gate of transistor 1804 is also coupled to input $\overline{TH}$. When $\overline{TH}$ is a logical high, the circuit will function as in FIG. 20. When $\overline{TH}$ is brought to a logical low, a logical high ($V_{DD}$) signal will be driven on Z. By coupling $\overline{TH}$ to all tri-state drivers and by bringing $\overline{TH}$ to a logical low when shift operation is to be entered, contention on tri-state outputs will be prevented during shift operation.

A system in accordance with the invention has thus been described that has several advantages over traditional techniques used for testing ASICs. First, the test circuitry in each STLB is predesigned within each function block and is thus not dependent on the ultimate user-designed circuit implemented by the gate array nor does the designer need to insert test circuitry himself.

The logic of particular function blocks also need not be dedicated solely to testing, but can be used to perform both test and normal operating functions—in other words, the STLB circuitry is reused for freeze and normal modes of operation. STLBs do not even need to implement sequential logic in the user-designed circuit to still be able to control and observe data in each STLB—i.e., even combinational logic is testable without having to insert extra flip-flops for testing purposes. Yet, only minimal additional transistors need to be added to the function blocks 420 to implement testing in accordance with the invention.

Further, each STLB is equipped with addressable mode control, allowing each STLB in each function block to be individually exercised. Nonetheless, the entire circuit implemented by the gate array can be tested relatively quickly using the dynamic partitioning of partition test.

A gate array designed in accordance with the invention can also emulate traditional scan techniques, allowing those circuit designers more comfortable with traditional scan testing to test the gate array in that manner.

Finally, the test clock signal can be independently enabled and disabled to each of the master and slave latches that form flip-flops used for test purposes, permitting the ability to independently shift test data into and out of the master and slave latches of a test flip-flop. Using latches and a TCLK in accordance with the invention also eliminates most DFT rules conventionally used in designing ICs since problems associated with testing edge-triggered flip-flops are eliminated (all testing is easily implemented with static patterns).

Although headings have been used in this description, they are to serve as a guide to the reader only and should not be construed to limit the invention.

It should be understood that the particular embodiments described above are only illustrative of the principles of the present invention, and various modifications could be made by those skilled in the art without departing from the scope and spirit of the invention. Thus, the scope of the present invention is limited only by the claims that follow.

What is claimed is:

1. An integrated circuit, comprising:
   an array of predesigned logic blocks, each logic block including a logic input and a logic output, wherein said predesigned logic blocks are couplable to one another to form a user-designed circuit; and,
   wherein, in a plurality of logic blocks in said array of predesigned logic blocks, at least one logic block is independently selectable with respect to the plurality of logic blocks to operate in a normal mode of operation or a freeze mode of operation, wherein the normal mode of operation is for use as part of the user-designed circuit and wherein the normal mode includes either a sequential mode of operation or a combinational mode of operation and wherein in the freeze mode of operation, the logic block is isolated from signals from said user-designed circuit on said logic input and holds on its logic output a loaded test value.

2. The integrated circuit of claim 1, wherein said logic blocks in said array of logic blocks are arranged in rows and columns, wherein each logic block in a respective row is in communication with a row mode line associated with said respective row and each logic block in a respective column is coupled to a column mode line associated with said respective column, wherein each logic block is selectable to operate in said normal mode of operation by signals carried on said row mode line and said colunm mode line while simultaneously other logic blocks in said array of logic blocks operate in said freeze mode of operation.

3. The integrated circuit of claim 1, wherein when one of said logic blocks in said plurality of logic blocks is selected to operate in said freeze mode of operation, said selected logic block behaves as a flip-flop.

4. The integrated circuit of claim 1, wherein when said logic blocks in said plurality of logic blocks are selected to operate in said freeze mode of operation, each logic block in said plurality of logic blocks behaves as a flip-flop, such that said plurality of logic blocks behave as a plurality of flip-flops, and said plurality of flip-flops are coupled to one another to form at least one daisy-chain such that test values can be shifted into and out of the array via said daisy chain.

5. The integrated circuit of claim 4, wherein when said plurality of logic blocks are selected to operate in said freeze mode of operation, each logic block in said plurality of logic blocks behave as a flip-flop, formed from a first latch and a second latch, and wherein test values are shifted into and out of said array via said daisy-chain under control of a test clock in communication with each of said flip-flops, and wherein said test clock is further in communication with control logic that allows the test clock to be independently enabled and disabled to each of said first latch and said second latch within each respective flip-flop.

6. The integrated circuit of claim 1, further comprising other logic interspersed among the logic blocks of said array of logic blocks, said other logic in communication with said array of logic blocks to form said user-designed circuit.

7. The integrated circuit of claim 1, wherein at least one logic block in said array of predesigned logic blocks further comprises logic block circuitry used in said normal mode of operation and said freeze mode of operation; and, wherein the logic block circuitry used in said freeze mode of operation is integrated with and inseparable from said logic block circuitry used in said normal mode of operation so that signals passing through said logic block circuitry during said normal mode of operation will also pass through said logic block circuitry used in said freeze mode of operation regardless of whether the normal mode of operation is combinational or sequential logic.

8. An integrated circuit, comprising:

an array of predesigned logic blocks, each logic block including logic block circuitry, wherein said predesigned logic blocks are couplable to one another to form a user-designed circuit;

wherein, in a plurality of logic blocks in said array of predesigned logic blocks, logic block circuitry of each respective logic block is configurable to operate in either a combinational logic mode of operation or a sequential logic mode of operation to perform a user-designed function and in an isolation mode of operation for use in testing said user-designed circuit; and, wherein said logic block circuitry of each respective predesigned logic block used in said isolation mode of operation is integrated with and inseparable from said logic block circuitry used in said combinational and sequential modes of operation so that signals passing through said logic block circuitry during said combinational or sequential modes of operation will also pass through said logic block circuitry used for said isolation mode of operation.

9. The integrated circuit of claim 8, further comprising other logic circuitry interspersed among the logic blocks of said array of logic blocks, said other logic circuitry couplable with said array of logic blocks to form said user-defined circuit.

10. The integrated circuit of claim 8, wherein when logic block circuitry of said logic blocks are selected to operate in said isolation mode of operation, logic block circuitry of each of said logic blocks in said plurality of logic blocks behaves as a flip-flop, such that said logic block circuitry of said logic blocks behave as a plurality of flip-flops, and said plurality of flip-flops are coupled to form a plurality of daisy-chains.

11. The integrated circuit of claim 10, wherein test values can be shifted into and out of the array via said plurality of daisy-chains under control of a test clock coupled to each of said flip-flops in said plurality of flip-flops.

12. The integrated circuit of claim 11, wherein each flip-flop is formed from a first latch and a second latch and wherein said test clock is further in communication with control logic that allows the test clock to be independently enabled and disabled to each of said first latch and said second latch within each respective flip-flop.

13. The integrated circuit of claim 8, wherein said logic blocks in said array of logic blocks are arranged in rows and columns, wherein said logic block circuitry in each logic block in a respective row is in communication with a row mode line associated with said respective row and logic block circuitry in each logic block in a respective column is coupled to a column mode line associated with said respective column, wherein logic block circuitry in each logic block is selectable to operate in either said combination logic mode of operation or said sequential logic mode of operation by signals carried on said row mode line and said column mode line while simultaneously other logic block circuitry of other logic blocks in said array of logic blocks operate in said freeze mode of operation.

14. An integrated circuit, comprising:

an array of predesigned logic blocks, wherein said predesigned logic blocks are couplable to form a user-designed circuit;

wherein each logic block in said array of logic blocks includes addressable mode control logic coupled to at least one mode select line, said addressable mode control logic for decoding signals carried on said at least one mode select line indicating whether said logic block is selected to operate in a freeze mode of operation, in which the logic block is isolated from said user-designed circuit, or in a normal mode of operation in which the logic block functions in either a sequential mode of operation or a combinational mode of operation; and, wherein at least one logic block is selectable to operate in said freeze mode of operation by signals carried on said at least one mode select line while simultaneously other logic blocks in said array of logic blocks operate in said normal mode of operation.

15. The integrated circuit of claim 14, wherein when one of said logic blocks in said plurality of logic blocks is selected to operate in said freeze mode of operation, said selected logic block behaves as a flip-flop.

16. The integrated circuit of claim 14, wherein when said logic blocks in said plurality of logic blocks are selected to operate in said freeze mode of operation, each logic block in said plurality of logic blocks behaves as a flip-flop, such that said plurality of logic blocks behave as a plurality of flip-flops, and said plurality of flip-flops are coupled to one another to form at least one daisy-chain such that test values can be shifted into and out of the array via said daisy chain.

17. The integrated circuit of claim 16, wherein when said plurality of logic blocks are selected to operate in said freeze mode of operation, each logic block in said plurality of logic blocks behave as a flip-flop, formed from a first latch and a second latch, and wherein test values are shifted into and out of said array via said daisy-chain under control of a test clock in communication with each of said flip-flops, and wherein said test clock is further in communication with control logic that allows the test clock to be independently enabled and disabled to each of said first latch and said second latch within each respective flip-flop.

18. An integrated circuit comprising:

an array of predesigned logic blocks, wherein said predesigned logic blocks are couplable to form a user-designed circuit;

wherein, in a plurality of logic blocks in said array of predesigned logic blocks, at least one logic block is configurable to operate in one of multiple normal modes of operation to perform a user-designed function and an isolation mode of operation for use in testing said user-designed circuit; and, wherein the array further includes a plurality of mode select lines, wherein at least one respective mode select line is in communication with a respective logic block, and wherein each of said logic blocks in said plurality of logic blocks is independently selectable using mode select lines to operate in one of said multiple normal modes of operation while simultaneously other logic blocks in said plurality of logic blocks operate in said isolation mode of operation.

19. The integrated circuit of claim 18, wherein said normal mode of operation is for use as part of the user-designed circuit and wherein the normal mode includes a sequential mode of operation or a combinational mode of operation, and wherein in the freeze mode of operation the logic block is isolated from signals from said user-designed circuit.

20. The integrated circuit of claim 18, wherein at least one logic block in said array of predesigned logic blocks further comprises logic block circuitry used in said multiple normal modes of operation and said freeze mode of operation; and, wherein the logic block circuitry used in said freeze mode of operation is integrated with and inseparable from said logic block circuitry used in said multiple normal modes of operation so that signals passing through said logic block circuitry during the normal mode of operation will also pass through said logic block circuitry used in said freeze mode of operation.

21. An integrated circuit comprising:

an array of predesigned logic blocks, wherein said predesigned logic blocks are couplable to form a user-designed circuit;

wherein, in a plurality of logic blocks in said array of predesigned logic blocks, each logic block is selectable to operate in either a combinational or sequential mode of operation as an operative part of said user-designed circuit and a freeze mode of operation, in which the logic block is isolated from said user-designed circuit;

wherein said array includes a plurality of column select lines and a plurality of row select lines, wherein a respective row select line and a respective column select line are in communication with a respective logic block, and wherein each of said logic blocks in said plurality of logic blocks are independently selectable using the row and column select lines to operate in said combinational or sequential mode of operation while simultaneously other logic blocks in said plurality of logic blocks operate in said freeze mode of operation.

22. The integrated circuit of claim 21, wherein at least one logic block in said array of predesigned logic blocks further comprises logic block circuitry used in said combinational mode, said sequential mode and said freeze mode of operation; and, wherein the logic block circuitry used in said freeze mode of operation is integrated with and inseparable from said logic block circuitry used in said combinational mode and said sequential mode of operation so that signals passing through said logic block circuitry during said combinational mode or said sequential mode of operation will also pass through said logic block circuitry used in said freeze mode of operation.

\* \* \* \* \*